(12) United States Patent
Downie et al.

(10) Patent No.: US 8,138,925 B2
(45) Date of Patent: Mar. 20, 2012

(54) RFID SYSTEMS AND METHODS FOR AUTOMATICALLY DETECTING AND/OR DIRECTING THE PHYSICAL CONFIGURATION OF A COMPLEX SYSTEM

(75) Inventors: John David Downie, Painted Post, NY (US); James Scott Sutherland, Corning, NY (US); Richard Edward Wagner, Painted Post, NY (US); Matthew Scott Whiting, Lawrenceville, PA (US); Dale Alan Webb, Corning, NY (US); Keith Allen Hoover, Corning, NY (US); Aravind Chamarti, Painted Post, NY (US)

(73) Assignee: Corning Cable Systems, LLC, Hickory, NC (US)

( * ) Notice: Subject to any disclaimer, the term of this patent is extended or adjusted under 35 U.S.C. 154(b) by 505 days.

(21) Appl. No.: 12/354,335

(22) Filed: Jan. 15, 2009

(65) Prior Publication Data

US 2009/0195363 A1 Aug. 6, 2009

Related U.S. Application Data

(60) Provisional application No. 61/011,194, filed on Jan. 15, 2008.

(51) Int. Cl.
*G08B 13/14* (2006.01)

(52) U.S. Cl. ............... 340/572.8; 340/10.1; 340/10.41; 340/539.1

(58) Field of Classification Search ............... None
See application file for complete search history.

(56) References Cited

U.S. PATENT DOCUMENTS

| | | | |
|---|---|---|---|
| 6,847,856 B1 * | 1/2005 | Bohannon | 700/115 |
| 6,924,781 B1 | 8/2005 | Gelbman | |
| 6,968,994 B1 * | 11/2005 | Ashwood Smith | 235/375 |
| 6,992,567 B2 | 1/2006 | Cole et al. | |
| 7,319,397 B2 | 1/2008 | Chung et al. | |
| 7,411,500 B2 | 8/2008 | Hamerly et al. | |
| 7,468,669 B1 * | 12/2008 | Beck et al. | 340/572.1 |
| 7,504,945 B2 | 3/2009 | Cox et al. | |
| 7,757,936 B2 | 7/2010 | Aguren et al. | |
| 7,760,094 B1 | 7/2010 | Kozischek et al. | |
| 7,772,975 B2 | 8/2010 | Downie et al. | |
| 7,782,202 B2 | 8/2010 | Downie et al. | |

(Continued)

FOREIGN PATENT DOCUMENTS

DE 102 44 304 B3 3/2004

(Continued)

*Primary Examiner* — Benjamin C Lee
*Assistant Examiner* — Curtis King
(74) *Attorney, Agent, or Firm* — Joseph M. Homa

(57) ABSTRACT

A radio-frequency identification (RFID)-based configuration detection system for automatically detecting, directing, and/or configuring the physical configuration of a complex system constituted by a set of one or more types of mateable components. The RFID configuration detection system utilizes a set of mateable RFID tags arranged so that each mateable component includes at least one mateable RFID tag. Each RFID tag includes information about its associated component and is arranged so that when the components are mated, their associated RFID tags also are mated. The system uses at least one RFID reader to read RFID tag signals from the RFID tags. The RFID tag signals provide information about mating status of the component, as well as information about components themselves. An information processing system operably connected to the RFID reader receives and process information concerning the number and type of mated connections and thus the configuration. Changes to the configuration, such as mated connections being unmated, can be tracked to provide real-time configuration information.

20 Claims, 15 Drawing Sheets

U.S. PATENT DOCUMENTS

| | | | |
|---|---|---|---|
| 2004/0052471 A1 | 3/2004 | Colombo et al. | |
| 2004/0123998 A1 | 7/2004 | Berglund et al. | |
| 2006/0042984 A1 | 3/2006 | Suzuki | |
| 2006/0091207 A1 | 5/2006 | Chang | |
| 2006/0148279 A1* | 7/2006 | German et al. | 439/49 |
| 2006/0153517 A1 | 7/2006 | Reagan et al. | |
| 2006/0206246 A1 | 9/2006 | Walker | |
| 2006/0257092 A1 | 11/2006 | Lu et al. | |
| 2006/0292311 A1 | 12/2006 | Kilburn et al. | |
| 2007/0055470 A1 | 3/2007 | Pietrzyk et al. | |
| 2007/0116411 A1 | 5/2007 | Benton et al. | |
| 2007/0176745 A1* | 8/2007 | Gibson et al. | 340/10.1 |
| 2008/0021766 A1 | 1/2008 | McElwaine et al. | |
| 2008/0100456 A1 | 5/2008 | Downie et al. | |
| 2008/0100467 A1 | 5/2008 | Downie et al. | |
| 2008/0139306 A1 | 6/2008 | Lutnick et al. | |
| 2008/0220721 A1 | 9/2008 | Downie et al. | |
| 2008/0240724 A1 | 10/2008 | Aguren | |
| 2009/0032577 A1* | 2/2009 | Aguren et al. | 235/375 |
| 2009/0079544 A1 | 3/2009 | Noble | |
| 2009/0096581 A1* | 4/2009 | Macauley et al. | 340/10.1 |
| 2009/0224039 A1 | 9/2009 | Hause et al. | |
| 2009/0240945 A1 | 9/2009 | Aronson | |
| 2009/0261955 A1 | 10/2009 | Moore et al. | |
| 2010/0080554 A1 | 4/2010 | Aguren | |

FOREIGN PATENT DOCUMENTS

| | | |
|---|---|---|
| EP | 1696680 A1 | 8/2006 |
| GB | 2 347 508 A | 9/2000 |
| WO | 2006/063023 A1 | 6/2006 |
| WO | 2008/075123 A1 | 6/2008 |
| WO | 2008076235 A1 | 6/2008 |

* cited by examiner

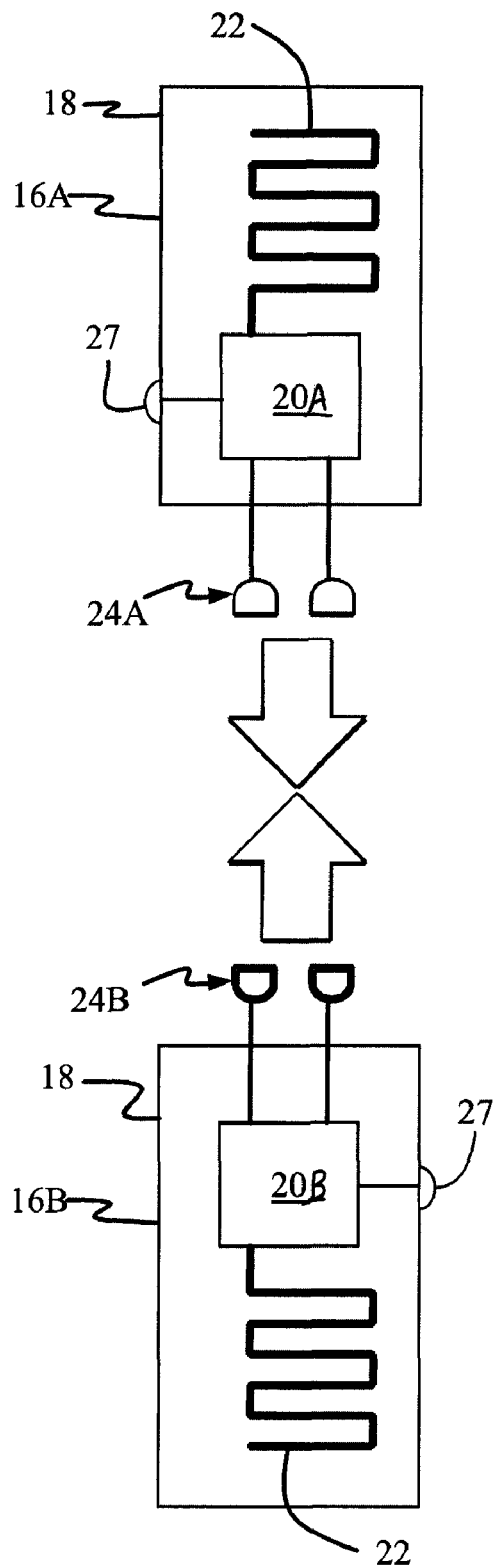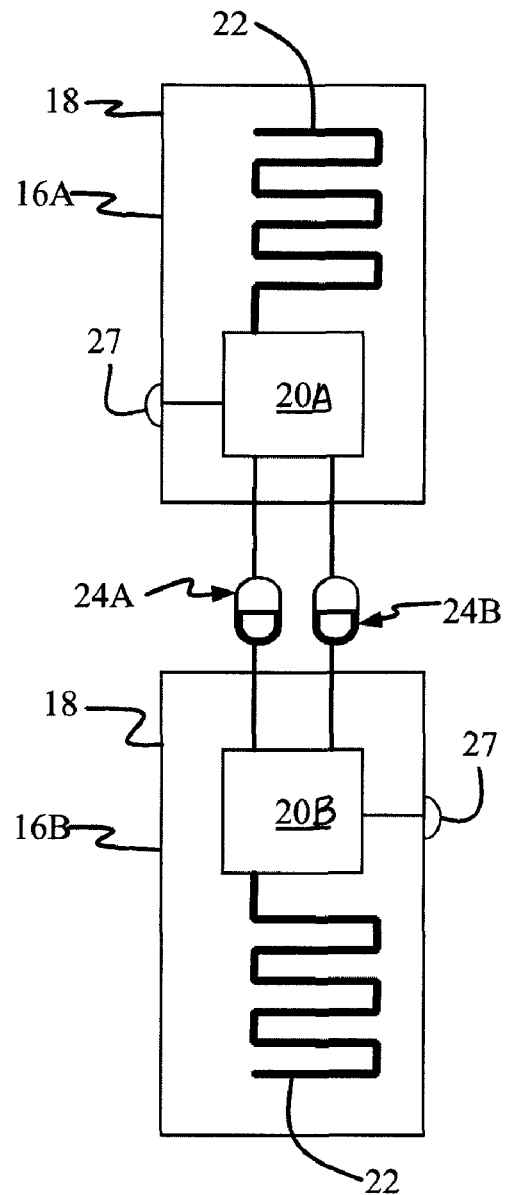
FIG. 2A
FIG. 2B

RFID SYSTEMS AND METHODS FOR AUTOMATICALLY DETECTING AND/OR DIRECTING THE PHYSICAL CONFIGURATION OF A COMPLEX SYSTEM

RELATED APPLICATIONS

The present application claims priority to U.S. Provisional Patent Application Ser. No. 61/011,194, filed on Jan. 15, 2008 and entitled "RFID SYSTEMS AND METHODS FOR AUTOMATICALLY DETECTING AND/OR DIRECTING THE PHYSICAL CONFIGURATION OF A COMPLEX SYSTEM," which is incorporated herein by reference in its entirety.

BACKGROUND

1. Field of the Disclosure

The technology of the disclosure relates generally to the use of radio-frequency identification (RFID) systems, and in particular is directed to RFID-based systems and methods for automatically detecting, directing, and/or configuring the physical configuration of a complex system, such as a telecommunications system.

2. Technical Background

Typical telecommunications data centers include large numbers of optical and electrical cable connections that join various types of network equipment. Examples of network equipment include electrically-powered (active) units such as servers, switches and routers, and unpowered (passive) units such as fanout boxes and patch panels. This network equipment is often installed within cabinets in standard (e.g., 19") equipment racks. Each piece of equipment typically provides one or more adapters where optical or electrical patch cables can be physically connected to the equipment. These patch cables are generally routed to other network equipment located in the same cabinet or to another cabinet.

A common issue in telecommunications data center management is determining the current configuration of all the optical and electrical links among all the network hardware equipment. The configuration of optical and electrical links can be completely determined if the physical locations of all connected patch cable connectors on installed network equipment are known.

Another issue is that some equipment is capable of being installed in any one of multiple orientations when only one particular orientation is correct or desirable. For example, a patch cable that contains a transmit optical fiber and a receive optical fiber needs to be connected to the corresponding adapter in the proper orientation or "polarization" so that the transmit/receive process can occur.

Information about the physical location and orientation of the adapters and their parent patch panels in data center cabinets is presently manually recorded and added to the network management software database after the adapters and patch panels are installed. This process is labor-intensive and prone to errors. Additionally, any changes made to the physical configuration of any network equipment must be followed up with corresponding changes to the network management software database, which delays providing the most up-to-date information about the system configuration. Furthermore, errors from manual recording and entry of configuration data tend to accumulate over time, reducing the trustworthiness of the network management software database. In addition, the need to connect a given connector or install a given piece of equipment in only one of a number of possible orientations also leads to errors in the system's physical configuration, as mentioned above. Finally, it is better to know of an incorrect connection as soon as it is made, rather than sometime later when a problem arises (e.g., loss of a connection or loss of data), and when the source of the problem is more difficult to diagnose.

SUMMARY OF THE DETAILED DESCRIPTION

A first aspect disclosed in the detailed description is a radio-frequency identification (RFID) system for detecting, directing, and/or configuring a configuration of a complex system having a set of one or more types of mateable components. The system includes a set of mateable RFID tags arranged so that each mateable component in the set includes at least one mateable RFID tag. The mateable RFID tags include information relating to their associated mateable components and are arranged so that the mating of components results in the mating of the corresponding RFID tags. The RFID system includes at least one RFID reader adapted to read an RFID tag signal sent from at least one RFID tag in a mated pair of RFID tags, wherein the at least one RFID tag signal contains information about the mated components. The RFID system also includes an information processing system operably connected to the at least one RFID reader. The information processing system is adapted to receive and process information therefrom to establish a number and type of mated connections that constitute the complex system configuration. The information processing system is also optionally adapted to provide directions for configuring the system so that an end-user can configure the complex system.

A second aspect disclosed in the detailed description is an RFID configuration detection system for detecting, directing, and/or configuring a configuration of a complex system having a set of one or more types of mateable components. The RFID system includes at least one mateable RFID tag associated with each mateable component in the set of mateable components and having an antenna electrically connected to an integrated circuit (IC) chip. The IC chip is adapted to store information that includes information relating to its associated mateable component. The at least one mateable RFID tag is arranged relative to its associated component such that mating two mateable components causes the corresponding at least one mateable RFID tag associated with the two mateable components to mate and exchange the information stored therein, and to communicate information regarding their mated status via at least one wireless RFID tag signal. The RFID system includes at least one RFID reader adapted to receive the at least one wireless RFID tag signal from each mated pair of components. The RFID system also includes an information processing system operably connected to the at least one RFID reader. The information processing system is adapted to receive therefrom and process said mated status information to determine the complex system configuration. The information processing system is also optionally adapted to provide directions for configuring the system so that an end-user can configure the complex system.

A third aspect disclosed in the detailed description is an RFID-based method of detecting and/or directing a configuration of a complex system having a set of one or more types of mateable components. The method includes providing each mateable component in the set with at least one mateable RFID tag that includes information about its associated mateable component, including arranging the at least one mateable RFID tag so that when two mateable components mate, the corresponding mateable RFID tags mate and exchange information about their respective mateable components. The method also includes mating a number of mateable components so as to cause the corresponding mateable RFID tags to mate and exchange information about their respective mateable component. The method further includes, for each pair of mated components, generating at least one RFID tag signal that includes information relating to the mated components. The method further includes receiving and processing the at least one RFID tag signal from each pair of mated components to determine the complex system configuration.

The method optionally includes directing a change in the system configuration by causing an RFID tag to attract the attention of a system end-user with respect to a first mateable component, and then indicating to the system end-user to connect a second mateable component to the first mateable component.

Additional features and advantages of the invention will be set forth in the detailed description which follows, and in part will be readily apparent to those skilled in the art from that description or recognized by practicing the invention as described herein, including the detailed description that follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate the various exemplary embodiments of the invention, and together with the description serve to explain the principals and operations of the invention.

BRIEF DESCRIPTION OF THE FIGURES

FIG. 2A is a close-up schematic diagram of an example embodiment of two mateable RFID tags used in the RFID configuration detection system of FIG. 1, prior to the tags being mated;

FIG. 2B is a schematic diagram similar to that of FIG. 2A, but with the two RFID tags mated;

DETAILED DESCRIPTION OF THE PREFERRED EMBODIMENTS

Figure 1:
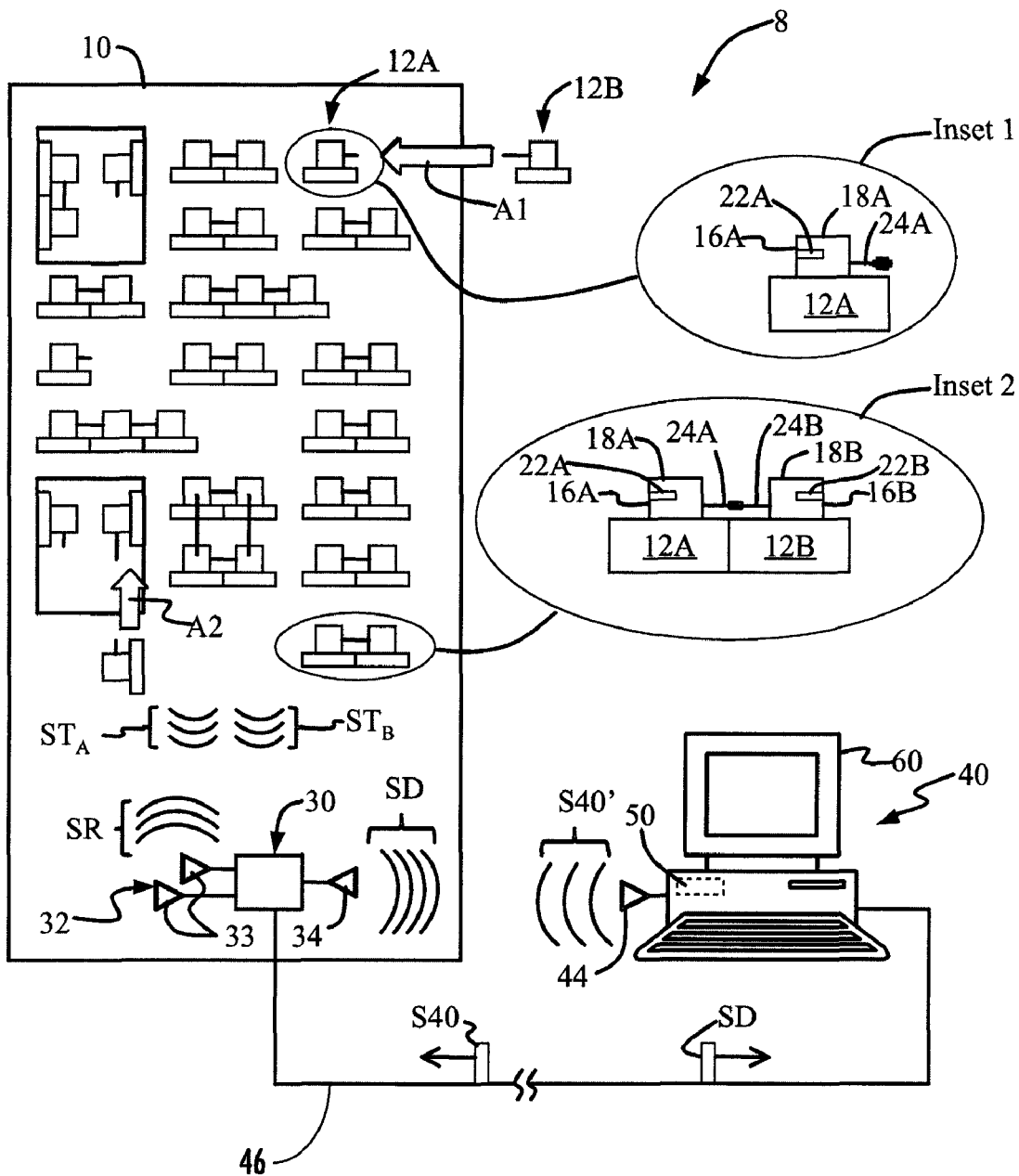
FIG. 1 is a schematic diagram of an example embodiment of an RFID configuration detection system as shown in operable relation with a generalized example of a complex system having a number of juxtaposed mateable components.

Reference will now be made in detail to the preferred embodiments of the present invention, examples of which are illustrated in the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Whenever possible, like reference numbers will be used to refer to like components or parts.

The detailed description discloses systems for and methods of automatically detecting the physical configuration of the components of a relatively complex apparatus, piece of equipment, appliance, device, instrument, tool, mechanism, system, etc. (collectively referred to hereinafter as a "complex system"). A related aspect includes directing the configuration of the complex system, and in particular the re-configuration of the system. Here, a "complex system" means a system having a number of mateable components that, because of their sheer numbers and/or the character of how the components mate, manually tracking the different possible system configurations can be tedious and/or can be relatively difficult and can lead to errors in the system configuration. In an example embodiment, what constitutes a "complex system" is not a function of the number of components per se, but rather is a function of the importance of achieving the proper mating connection among different system components, and the adverse consequences associated with making one or more improper connections. Thus, in embodiments disclosed herein, a system having just a few mateable components can be considered a "complex system" if manually tracking the configuration of the mateable components is problematic due to their location and/or if the adverse consequences to the system are considered severe if the configuration is improper or if the configuration changes due to a component failure or other unintended reason.

In an example embodiment, the systems and are described in connection with complex systems based on telecommunications system apparatus. Such apparatus includes components in the form of various types of network equipment, including the associated optical and electrical links in a data center application. Each system component (e.g., a piece of network equipment such as patch cable connectors, adapters, patch panels and rack-mounted housings, electronics and optical/electrical equipment, etc.) is provided with one or more RFID tags that are able to detect physical mating with RFID tags on other network equipment.

In another example embodiment, the RFID tags (which are also referred to in the art as "RFID transponders") include a switch (e.g., a push-button-type switch) that electrically connects/disconnects and activates/deactivates the RFID antenna so that a person (e.g., a technician) installing components into the complex system can selectively activate the RFID tags during the process. In another embodiment, the switch provides a latchable signal to the integrated circuit (IC) as an IC input rather than or in addition to connecting or activating the antenna. For example, the technician can activate the RFID tag to generate a signal representative of the type of component to which the RFID tag is attached, and where the component is to be connected. An example of such an RFID tag is described in U.S. patent application Ser. No. 11/590,377 filed Oct. 31, 2006 and entitled "Radio Frequency Identification Transponder for Communicating the Condition of a Component," which is incorporated herein by reference in its entirety.

Generally speaking, the term "component" as used herein is intended to be widely construed to include, for example, a piece of equipment, device, tool, apparatus, connector, structure, element, constituent, module, part, unit, machinery, gear, etc. that makes up the complex system and that plays a role in determining the complex system configuration. In example embodiments, some components of the complex system need not be considered when detecting the system configuration. What constitutes a component that needs to be considered when detecting the system configuration will depend on the nature of the complex system and the end-user's needs with regard to what constitutes operable and non-operable states of the complex system. For example, in the discussion below, a telecommunications system cabinet is considered, wherein the cabinet has a frame. In certain instances, the frame can be considered a "component" because it supports an equipment rack and may be worth identifying as a specific frame amongst a host of such frames in a central office. On the other hand, the frame as a component may not be considered relevant by the end-user as compared to detecting other components, such as jumper cables, when there is only one frame in a particular closet, for example. Thus, in the discussion and in the claims, a "set" of mateable components is considered, wherein the set can include some or all of the total number of components that constitute the complex system, as the case may be.

In the discussion below and in the figures, numbers presented in italics represent identification (ID) numbers N that generally include information having at least one piece of data relating to the component to which it is attached, such as for example, one or more serial numbers, relative locations, orientations, etc. In an example embodiment, the ID numbers N are stored and processed by the RFID configuration detection system in order to detect and communicate (e.g., display) the configuration of the complex system.

An example application of embodiments disclosed herein is described below in connection with telecommunications applications. However, the methods of detecting and/or directing the physical configuration of the complex system using mating RFID tags that exchange information (e.g., in the form of unique component ID numbers N) and that communicate their mating status can be used to automatically determine the configuration of any complex system having physically mateable components, and to direct the configuration (including the re-configuration) of the complex system.

Reference is now made in detail to certain embodiments, examples of which are illustrated in the accompanying drawings. Whenever possible, like or similar reference numerals are used throughout the drawings to refer to like or similar parts. The exemplary embodiments employ RFID technology that allows for automatically detecting and communicating the physical configuration of a complex system such as a telecommunications system. It should be understood that the embodiments disclosed herein relating to telecommunications systems are merely examples, each incorporating certain benefits. Various modifications and alterations may be made to the following examples within the scope of the present invention, and aspects of the different examples may be mixed in different ways to achieve yet further examples. Accordingly, the true scope of the invention is to be understood from the entirety of the present disclosure, in view of but not limited to the embodiments described herein. For example, in the example embodiments below, only a single RFID reader and antennas at the top and bottom of the racks or cabinets are shown and described for the sake of illustration. However, embodiments include configurations wherein one, two, or even more antennas are arranged in each shelf unit and/or wherein each shelf is completely independent of its rack and has one or more readers and one or more antennas associated therewith as needed to establish the configuration-detecting and/or configuration directing functionalities of the present invention as described in detail below.

FIG. 1 is a schematic diagram of an example embodiment of an RFID configuration detection system ("RFID system") 8 according to embodiments disclosed herein, which is an RFID system capable of automatically detecting and communicating the physical configuration of a complex system. RFID system 8 also can be used to direct the configuring of the complex system, and in particular, the reconfiguring of the complex system. In an example embodiment, the physical configuration includes the presence or absence of various parts independent of their connectivity. For example, RFID system 8 of some embodiments may be configured to serve one or more other functions, such as the function of asset/inventory management, in addition to its configuration detection and configuration directing functions. RFID system 8 is shown interfaced with an example complex system 10 that includes a set of one or more different types of components 12. For the sake of illustration, the set of components 12 include a number (e.g., a subset) of one or more different types of first components 12A (see, e.g., Inset 1) and a number (e.g., a subset) of one or more different types of second components 12B that are mateable with one, some or all of the first components (see, e.g., Inset 2).

Each first component 12A has associated therewith (e.g., fixed thereto) a first RFID tag 16A. First components 12A are all shown schematically as being the same, though in practice a variety of different types of first components are typically included in complex system 10. Each component 12A is configured to mate with (e.g., mechanically, electrically or optically connect to) or otherwise be placed in operable relationship with a corresponding second component 12B that has associated therewith (e.g., fixed thereto) a second RFID tag 16B. RFID tags 16A and 16B are configured to mate (i.e., electrically connect) when first component 12A mates with or is otherwise arranged in operable relationship to its counterpart second component 12B.

For example, in the case where complex system 10 is a telecommunications cabinet as discussed below, components 12A and/or 12B may be, for example, rack-mountable electronic devices, rack-mountable electrical/optical devices, rack-mountable housings, patch panels, jumper cables, switches, routers, servers, and the like. These components may need to be arranged in the system in a select manner, e.g., a select orientation, and with select connections.

Note that the terms "first" and "second" components are used in the present example for the sake of convenience. The various components could also include "third" components that mate with the second components, "fourth" components that mate with the third components, etc. Thus, the invention can include embodiments wherein three or more RFID tags may all communicate to each other rather than just two tags in a point-to-point topology, e.g., on a common bus or star configuration, such as shown schematically in some of the components and RFID tags in complex system 10 of FIG. 1.

RFID tags 16A and 16B (which are referred to collectively as "RFID tag 16" when discussing properties common to each tag) are discussed in greater detail below. Each RFID tag 16 includes a substrate 18, an IC chip 20 (not shown in FIG. 1; see FIGS. 2A and 2B), an antenna 22, and electrical contact members 24. Each RFID tag 16 is adapted to store information in IC chip 20. In an example embodiment, this information includes at least one piece of data relating to the RFID tag's 16 associated component 12. Each RFID tag 16 is also adapted to mate with an RFID tag of an associated component (via contact members 24) and share and store information when the two related components 12A and 12B are brought into their operable (or in some cases, an inoperable) configuration in complex system 10.

With continuing reference to FIG. 1, RFID system 8 further includes at least one RFID reader 30 that has an RFID antenna system 32 with at least one antenna element 33. RFID reader 30 also optionally includes a second antenna system 34 for transmitting wireless data signals SD. RFID reader 30, and in particular RFID antenna system 32, is preferably arranged relative to complex system 10 so that it can receive RFID tag signals ST from all of the RFID tags 16 used to monitor the configuration of the complex system. In an example embodiment, this involves strategically arranging a plurality of antenna elements 33 throughout complex system 10. In an example embodiment, RFID reader 30 is configured to switch between antenna elements 33 so that it can selectively interrogate and/or receive RFID tag signals ST from RFID tags 16 located in different regions of complex system 10. In an example embodiment, multiple RFID readers 30 and multiple antenna elements 33 are used to provide RF coverage of complex system 10.

With continuing reference to FIG. 1, RFID system 8 further includes an information processing system 40, such as a computer, operably connected to RFID reader 30 and adapted to store and process information from RFID reader 30. In an example embodiment, information processing system 40 includes a wireless antenna 44 (e.g., a wireless card) that receives wireless data signals SD from RFID reader 30 and that can transmit RF wireless communication signals S40 to RFID reader 30 (e.g., to elicit the transmission of information from the RFID reader). In an example embodiment, information processing system 40 includes a wire (e.g., an Ethernet cable) 46 connected to RFID reader 30 for wired communication with RFID reader 30 via electronic data signals SD and/or electronic communication signals S40.

Information processing system 40 can include a database unit 50 adapted (e.g., via database unit software stored on a computer-readable medium) to store and process information, particularly information about RFID tags 16 provided to the information processing system 40 from RFID reader 30. In an example embodiment, database unit 50 includes basic (e.g., background or general) information about complex system 10, such as its overall structure, the number of components 12 that constitute the system, the different types of components making up the system, orientation information about orientation-sensitive components, etc. In an example embodiment, this basic information is inputted into database unit 50 (e.g., manually, or via an external computer-readable medium such as a compact disk or so-called "memory stick") prior to any configuration-status information being received from RFID reader 30. In an example embodiment, information processing system 40 includes a display 60, such as a standard liquid crystal display (LCD) monitor or personal digital assistant (PDA), to provide two non-limiting examples, that displays (e.g., using graphics and/or alphanumerics) the system configuration information stored in database unit 50.

With continuing reference to FIG. 1, consider now one of the second components 12B, such as for example a second piece of telecommunications network equipment (e.g., a patch panel), being installed into complex system 10 so as to mate with one of the first components 12A, as illustrated by arrow Al (see also see Inset 2). This installation may involve, for example, placing a telecommunications network component into a rack-mounted housing 12H (not shown in FIG. 1; see FIG. 3), as illustrated by arrow A2, and as discussed in an example embodiment below. While first component 12A mates with second component 12B, the RFID tag 16B on second component 12B electrically mates with RFID tag 16A of first component 12A via respective contact members 24B and 24A, as illustrated in Inset 2.

RFID tags 16 are configured to store information in IC chip 20, such as ID numbers N, and exchange these numbers with its mated RFID tag. RFID tags 16 are also configured to transmit some or all of this information via a wireless RFID tag signal ST (i.e., RFID tag signals $ST_A$ and $ST_B$ for RFID tags 16A and 16B, respectively) transmitted by antenna 22. In an example embodiment, RFID reader 30 is adapted to transmit RF wireless reader signals SR, which in an example embodiment are used to interrogate (poll) one or more RFID tags 16. In another example embodiment, reader signals SR are used to write information to one or more RFID tags 16, or to activate a signaling device 27, such as a light (e.g., a light emitting diode (LED), on one or more of the RFID tags 16 (see FIG. 2B). RFID reader 30 also transmits the pairs of RFID tag ID numbers N (e.g., ID numbers NA and NB for mated RFID tags 16A and 16B) for all mated components 12 to information processing system 40 using (wireless and/or wired) data signals SD.

Database unit 50 within information processing system 40 stores and processes the information about complex system 10. In an example embodiment, database unit 50 combines the information received from RFID reader 30 with previously stored basic information about complex system 10 to map all received RFID tag ID numbers N to known component types. Using the pairs of RFID tag ID numbers N, information processing system 40 automatically determines the relative positions (and optionally the component orientation of orientation-sensitive components) of the mated components 12. As mentioned above, this information can then be displayed on display 60 to provide a user with a (real-time) view of the configuration of complex system 10.

For example, where complex system 10 is a part of a telecommunications network, information processing system 40 automatically indicates which patch panel is attached to which port on a given rack-mounted housing. This information is recorded in database unit 50 without it ever having to be manually entered. In an example embodiment, information processing system 40 also immediately detects when other components 12 (e.g., patch cables, patch panels, housings, switches, routers, and servers in the case of a telecommunications application) are added or removed from complex system 10 (e.g., from any data center cabinets), and automatically updates database unit 50 to reflect any changes in the configuration of complex system 10. This method leverages the pre-configuration of all RFID tags 16 at manufacture time and also provides a real-time configuration status of complex system 10.

In an example embodiment where a component 12 includes more than one RFID tag 16 (e.g., a patch panel with twelve adapters, where each adapter has its own RFID tag), a standardized ID number scheme is used for each RFID tag so that its physical position P in complex system 10 (or its position relative to another component) can be determined via its ID number N. In addition, for components having orientation sensitivity, the RFID tag information allows the database unit software to determine if the orientation of the installed component is correct.

FIG. 2A is a schematic diagram of an example embodiment of two mateable RFID tags 16A and 16B according to embodiments disclosed herein, prior to the RFID tags being mated. RFID tag substrate 18 supports RFID (IC) chip 20 and RFID antenna 22, which is electrically connected to IC chip 20. IC chip 20 is configured to store information, such as the above-mentioned ID number N, which in turn may include one or more pieces of data, such as a serial number, component type, component manufacturer, manufacturing date, installation date, location, lot number, performance parameters (such as attenuation measured during installation), identification of what is at the other end of the component, etc. In an example embodiment, such information is preloaded onto IC chip 20 at manufacture time, or is loaded onto IC chip 20 using RFID reader 30 and reader signals SR.

In an example embodiment, contact members 24A are "pogo pins" electrically connected to IC chip 20A, while contact members 24B are in the form of contact pads or contact slots electrically connected to IC chip 20B and adapted to mate with contact members 24A to establish an electrical connection between IC chips 20A and 20B, as shown in FIG. 2B. This allows IC chips 20A and 20B to exchange information, such as their respective ID numbers N, as well as a status indicator (e.g., a bit sequence) that indicates that RFID tags 16A and 16B are mated. In an example embodiment, this information is provided to RFID reader 30 in response to subsequent RFID reader polls via reader signals SR. This embodiment is preferred when RFID tags 16 require a polling signal from RFID reader 30 to power the IC chip 20. In another example embodiment where IC chips 20 do not rely on an incoming signal for power, the RFID tags 16 automatically transmit this information when they are mated.

When RFID tags 16A and 16B are disconnected, in an example embodiment their disconnected state is saved in their respective IC chips 20A and 20B to indicate that they are disconnected from one another. This "disconnect" state is communicated to RFID reader 30 on subsequent RFID reader polls via reader signals SR or is transmitted by the RFID tags 16 at or near the time when the disconnection occurs. This disconnect state can also be displayed using signaling device 27 on one or both of the RFID tags 16 associated with disconnected components 12.

Figure 3:
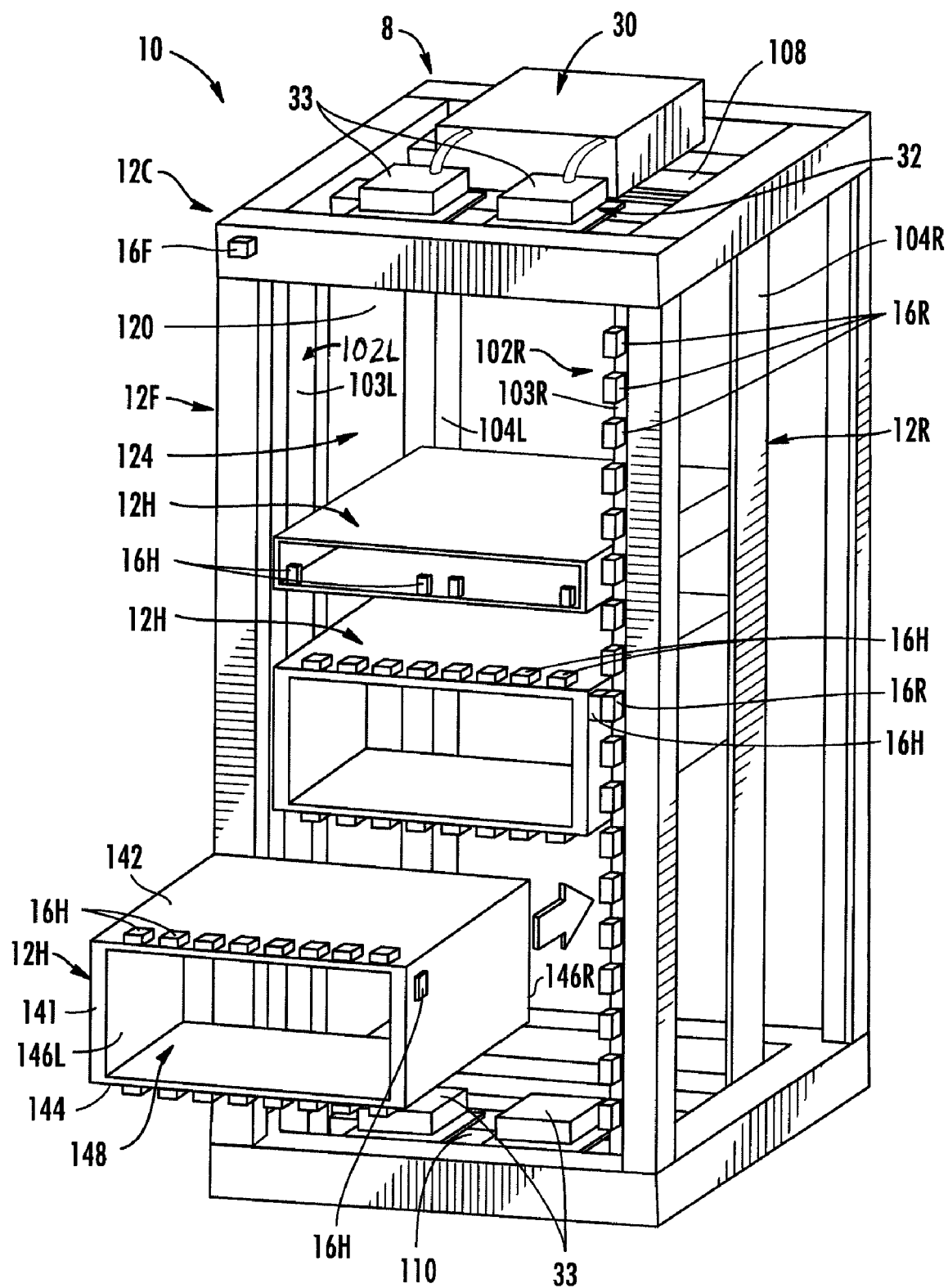
FIG. 3 is a perspective diagram of an example embodiment of a complex system in the form of a telecommunications system cabinet having a number of mateable components that include a cabinet with an equipment rack that holds rack-mountable housings, which in turn house various other types of telecommunications system components.

FIG. 3 is a perspective diagram of an example embodiment of a complex system 10 in the form of a telecommunications system cabinet 12C. Cabinet 12C, which itself is considered a "component," includes an outer support frame 12F that supports right and left inner front vertical rails 102R and 102L (hereinafter, "right and left front rails") with respective right and left front faces 103R and 103L. Support frame 12F also supports right and left inner rear vertical rails 104R and 104L (hereinafter, "right and left rear rails"), and includes a top panel 108 and a bottom panel 110. Support frame 12F and top and bottom panels 108 and 110 define a frame interior 120 with a front opening 124. In an example embodiment, support frame 12F includes a frame RFID tag 16F that includes information about the support frame (e.g., its serial number, its location, its installation date, the types of components it supports, etc.).

In an example embodiment, front and rear rails 102 and 104 include support brackets (not shown) and define an equipment rack 12R that supports one or more telecommunications network-related components 12 such as, for example, rack-mountable housings 12H configured to be stored in a stacked fashion within frame interior 120. In one example embodiment, each rack-mountable housing 12H includes a front 141, a top panel 142, a bottom panel 144, and right and left side panels 146R and 146L that define an open housing interior 148.

RFID system 8 includes one or more "rail" RFID tags 16R mounted on front right 102R (e.g., on front surface 103R). RFID system 8 also includes one or more "housing" RFID tags 16H mounted on each housing 12H. In an example embodiment, at least one of the housing RFID tags 16H is mounted on one of the housing side panels 146R or 146L so as to mate with a corresponding rail RFID tag 16R when housing 12H is supported within equipment rack 12R of cabinet 12C. Other housing RFID tags 16H are shown arranged on housing top panel 142 as well as within housing interior 148 for mating with RFID tags on individual patch panels, as discussed below.

In an example embodiment, all rail RFID tags 16R in RFID system 8 are programmed at the time of manufacture with the aforementioned unique ID numbers N. In an example embodiment, ID numbers N indicate, for example, both a serial number N for the component and the relative position P of the component RFID tag. For example, ID numbers NR for rail RFID tags 16R indicate each RFID tag's 16R relative position along front rail 102R. This also allows each rail 102 to be automatically associated with a cabinet ID number $N_C$ of the cabinet 12C (or frame ID number $N_F$ of the frame 12F) in which it is installed. Likewise, in an example embodiment, all housing RFID tags 16H are programmed at the time of manufacture with unique identification numbers $N_H$ that indicate both the housing serial number and the position of the RFID tag $P_H$ on the housing (e.g., its relative location along the top panel 142).

In an example embodiment, at least one RFID reader 30 is included within, on or near cabinet 12C. In one example embodiment, RFID reader 30 is mounted on frame top panel 108 (as illustrated in FIG. 3) or on frame bottom panel 110. RFID reader antenna system 32 is preferably arranged to optimize RFID tag communication. In an example embodiment, antenna system 32 includes two or more antenna elements 33 arranged in different locations within, on or around cabinet 12C to ensure that RFID reader 30 can read RFID tag signals ST from all RFID tags 16 of RFID system 8 associated with the complex system 10 defined by cabinet 12C, and to transmit RFID reader signals SR to one or more of the RFID tags. Also, as discussed above, in an example embodiment, RFID reader 30 is configured to switch between antenna elements 33 so that it can selectively interrogate RFID tags 16 with RFID signals SR and/or receive RFID tag signals ST from RFID tags 16 located within different regions of cabinet 12C.

An example embodiment of RFID system 8 provides various RFID tags 16 arranged such that if a given component 12 of complex system 10 is not installed in its proper orientation, the corresponding RFID tags 16 cannot mate. For example, with reference to FIG. 3, if housing 12H were mounted upside down in cabinet 12C, the corresponding rail RFID tags 16R and the housing RFID tags 16H would not mate because there are no rail RFID tags on left front vertical rail 102L. Failure to generate at least one RFID tag signal ST upon installing housing 12H would indicate an incorrect housing orientation and thus an incorrect configuration for cabinet 12C.

Figure 4:
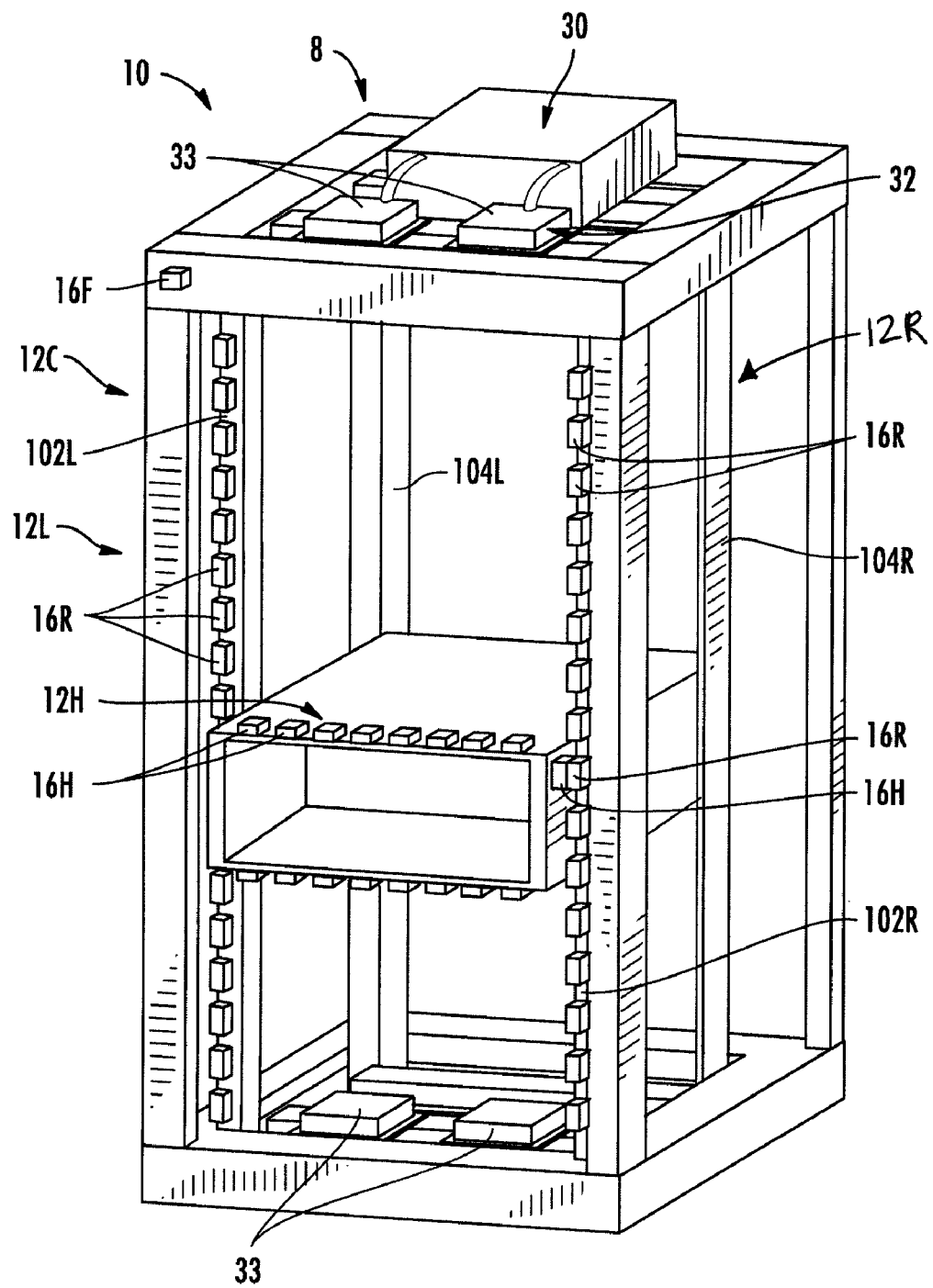
FIG. 4 is a perspective diagram similar to FIG. 3, illustrating an example embodiment wherein the cabinet includes rail RFID tags arranged along both front vertical rails of the equipment rack to provide RFID tag connection redundancy as well as orientation information of the rack-mountable housing when mounted in the equipment rack.

In an alternate example embodiment illustrated in FIG. 4, rail RFID tags 16R are provided on both right and left front vertical rails 102R and 102L. In this case, the corresponding rail RFID tags 16R and housing RFID tags 16H mate when the housing is added to equipment rack 12R, but each housing RFID tag 16H is programmed to indicate if it is on the top or bottom of the particular housing. The redundant rail RFID tags 16R provide information about the installation of housing 12H even with the failure of one of the rail RFID tags, or if there is tag-mating failure on one end of the housing. In an example embodiment, this same redundancy method is applied to some or all of the other components, such as the modules within the housing, or even adapters within the modules.

When housing 12H is installed in cabinet 12C, the housing RFID tag 16H on side panel 146R automatically mates with the corresponding rail RFID tag 16R on front vertical rail 102R, and the RFID tags 16 exchange information. When the mated RFID tags 16R and 16H are polled by reader signal SR from RFID reader antenna system 32, in an example embodiment both RFID tags 16 respond with respective RFID tag signals ST that include the identification number of their mating RFID tag 16 (see e.g., FIG. 1) and optionally a status indicator (e.g., a bit sequence) that indicates that RFID tags 16H and 16R are mated.

Figure 5A:
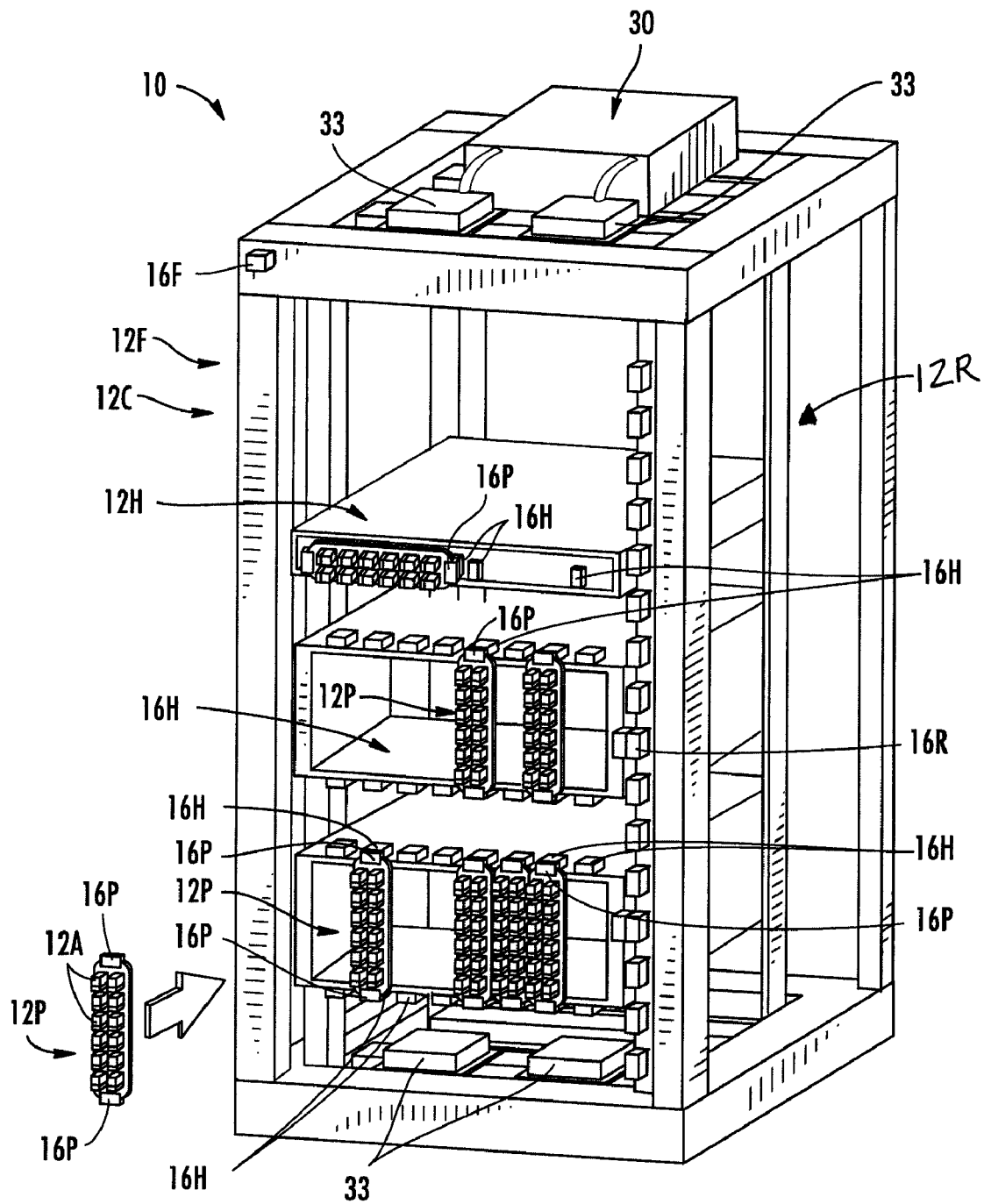
FIG. 5A is a perspective diagram similar to FIG. 3, illustrating the addition of patch-panel components to the rack-mounted housings, wherein the patch-panel components include patch-panel RFID tags that mate with the corresponding housing RFID tags.
Figure 5B:
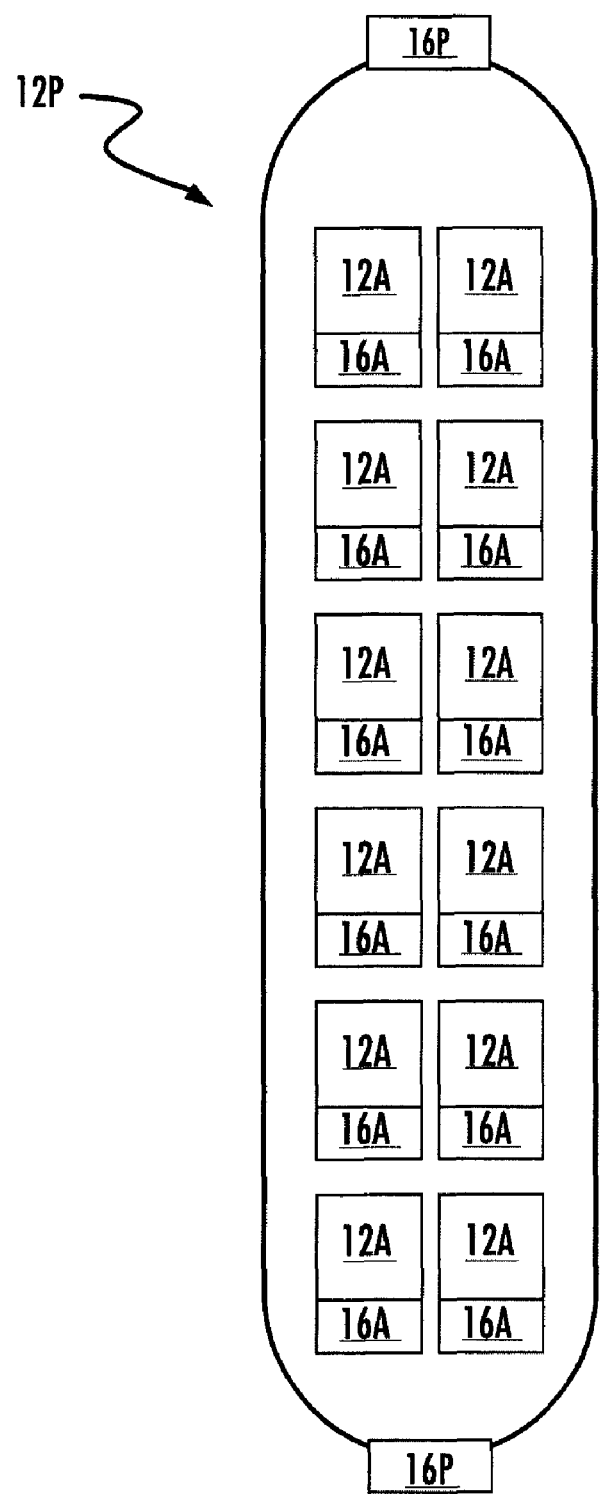
FIG. 5B is a close-up front view of an example embodiment of a patch-panel component that includes two patch-panel RFID tags, and wherein each adapter in the patch panel has an associated adapter RFID tag.

FIG. 5A is a schematic diagram similar to FIG. 3, but showing the insertion of patch panels 12P in rack-mounted housings 12H that are already installed within equipment rack 12R of cabinet 12C. Patch panels 12P include at least one patch-panel RFID tag 16P. Patch panel 12P includes an array of adapters 12A, with each adapter having associated therewith an adapter RFID tag 16A, as illustrated in the close-up front-on view of patch panel 12P of FIG. 5B.

Figure 5C:
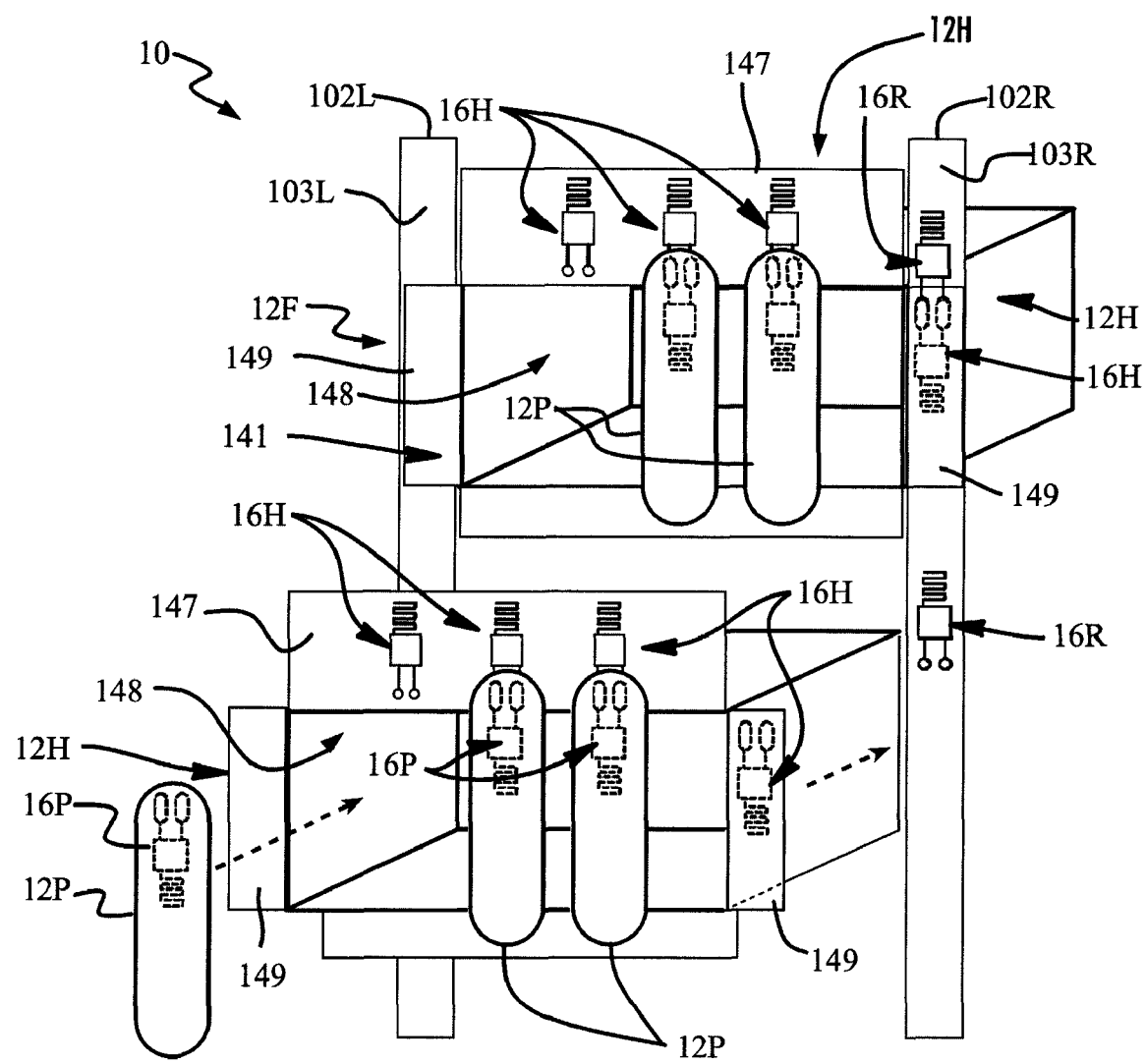
FIG. 5C is a close-up perspective schematic diagram similar to FIG. 5A, showing in greater detail how the patch-panel RFID tags mate with the housing RFID tags, and how the housing RFID tags mate with the rail RFID tags.

FIG. 5C is a close-up schematic diagram similar to FIG. 5A, showing more details of how patch-panel RFID tags 16P mate with the corresponding housing RFID tags 16H, and how rail RFID tags 16R on right front vertical rail 102R mate with the corresponding housing RFID tags 16H. In FIG. 5C, adapters 12A are omitted for ease of illustration. Housing 12H in FIG. 5C is shown as having a top front flange 147 and two side front flanges 149 that facilitate mounting the housing in equipment rack 12R. Top front flange 147 includes a number housing RFID tags 16H (three such RFID tags are shown). Right-side front flange 149 includes another housing RFID tag 16H. When a patch panel 12P is mounted to front 141 of housing 12H, the patch-panel RFID tag 16P mates with the corresponding housing RFID tags 16H on top front flange 147. Likewise, when housing 12H is mounted into equipment rack 12R of cabinet 12C, housing RFID tag 16H on right-side front flange 149 mates with rail RFID tag 16R on face 103R of vertical right front rail 102R.

As illustrated generally in FIG. 1, when the RFID tags 16 are polled by RFID reader signal SR, the mated RFID tags respond by transmitting an RFID tag signal ST that includes the ID number N of their mating RFID tag. Further, as shown in FIG. 5A, housing 12H may include additional housing RFID tags 16H on a bottom panel 144 to provide a way to detect whether the orientation of the inserted patch panel is incorrect (i.e., installed upside-down).

Figure 6A:
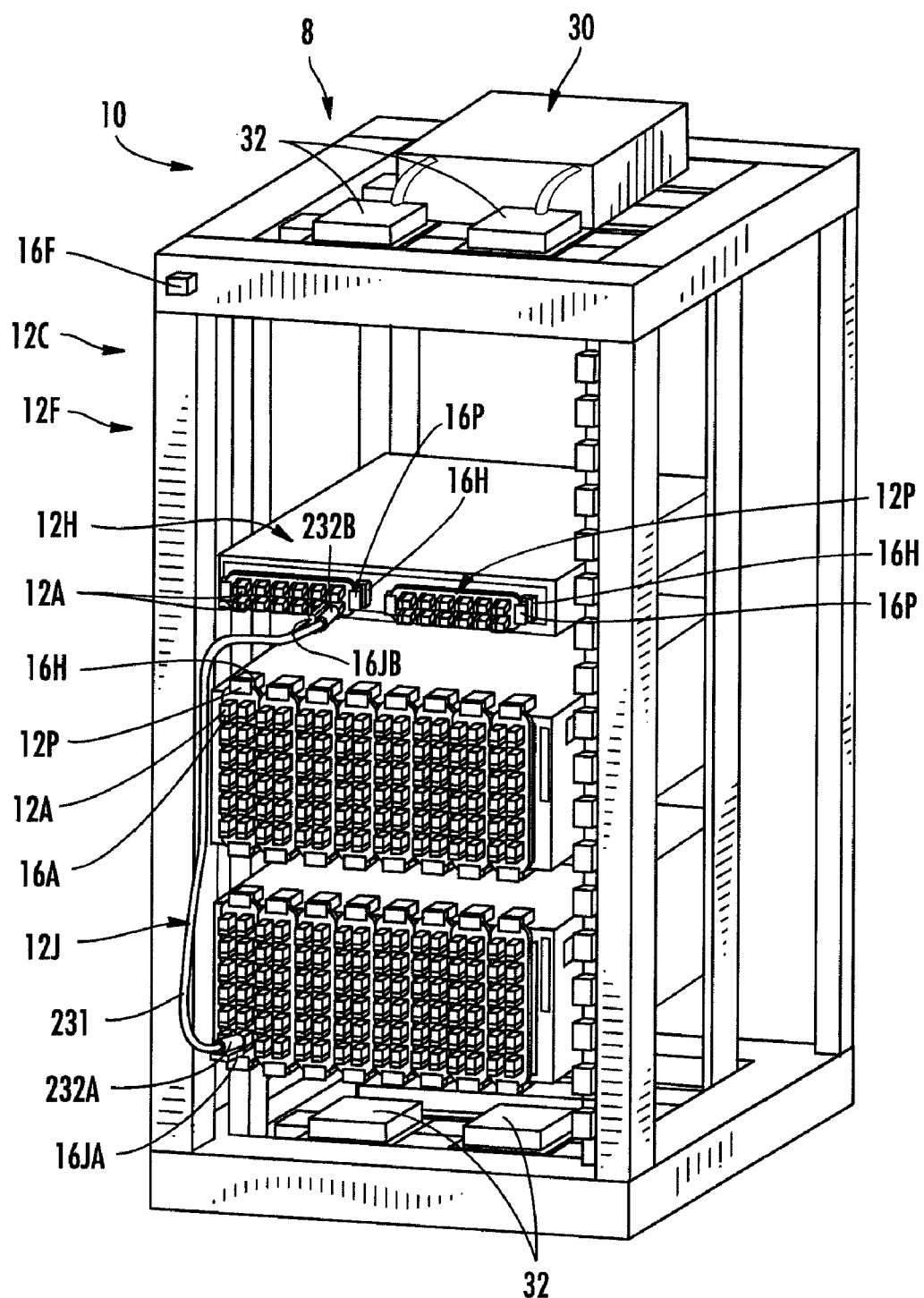
FIG. 6A is a perspective diagram similar to FIG. 5A, illustrating the addition to the system of a jumper cable connected to two adapters of different patch panels.
Figure 6B:
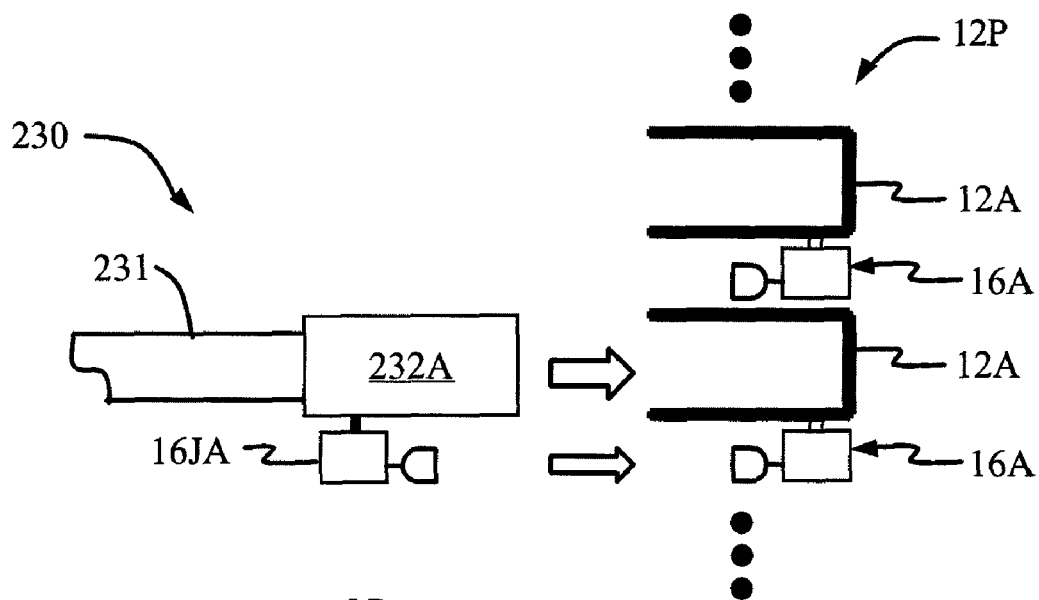
FIG. 6B is a close-up side view of the jumper cable and one of its connectors prior to the connector being inserted into an adapter of the patch panel and the jumper RFID tag mating with the adapter RFID tag.

FIG. 6A is a schematic diagram of RFID system 8 and complex system 10 similar to that shown in FIG. 5A, illustrating the addition to cabinet 12C of another component in the form of a patch cable (or "jumper" cable) 12J that enables a communication link between two adapters 12A on two separate patch panels 12P. Jumper cable 12J includes a cable section 231 and connectors 232A and 232B at the cable's opposite ends. In an example embodiment, each connector 232A and 232B of jumper cable 12J respectively includes a jumper RFID tag 16JA and 16JB integrated therewith or otherwise fixed thereto, as shown in the close-up side view of the jumper cable and adapter array 230 of FIG. 6B. In an example embodiment, jumper RFID tags 16J are programmed at the time of manufacture with a unique identification number $N_J$ that indicates both the jumper cable serial number and the specific connector type used on the jumper cable.

Figure 6C:
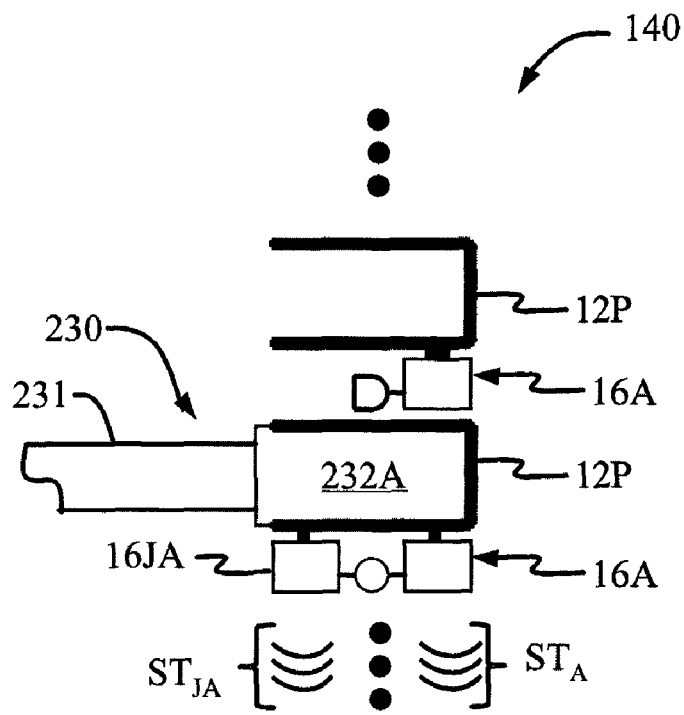
FIG. 6C is similar to FIG. 6B, illustrating the jumper cable connector mated with the patch-panel adapter, and the jumper RFID tag mated with the adapter RFID tag, and also showing the subsequent transmission of RFID tag signals from the two RFID tags to the RFID reader.

With reference now to FIG. 6C, when jumper connector 232A is installed in a patch panel adapter 12A, its jumper RFID tag 16JA automatically mates with the corresponding adapter RFID tag 16A of patch panel 12P. When the mated RFID tags 16JA and 16A are polled by RFID reader signal SR from RFID reader 30, one or both RFID tags respond with transmitting respective RFID tag signals ST (i.e., $ST_{JA}$ and/or $ST_A$) that include the ID number N of their mating RFID tag. In an alternative example embodiment, only one of the mated RFID tags (16JA or 16A) transmits a RFID tag signal ST that includes both ID numbers $N_J$ and $N_A$ and optionally a status indicator (e.g., a bit sequence) that indicates that RFID tags 16JA and 16A are mated.

Figure 7:
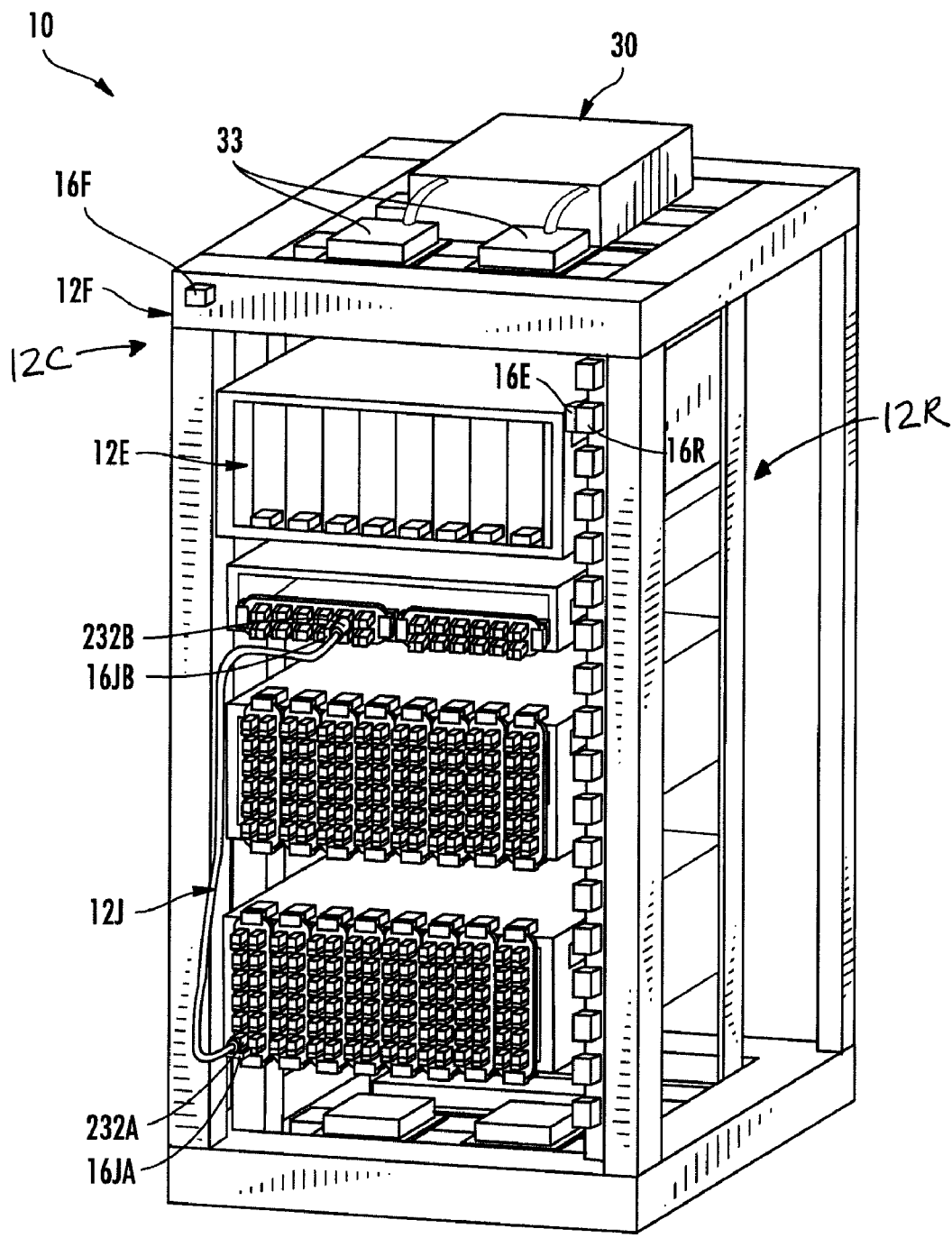
FIG. 7 is similar to FIG. 6A, and shows the addition to the telecommunications cabinet of another component in the form of rack-mounted electronics.

FIG. 7 is similar to the view of RFID system 8 and cabinet 12C of FIG. 6A, and shows the addition to equipment rack 12R of another rack-mounted component in the form of rack-mounted electronics 12E. Like the previous components added to cabinet 12C, rack-mounted electronics 12E includes an electronics RFID tag 16E configured to mate with a corresponding rail RFID tag 16R on right front face 103R of right front vertical rail 102R. In an example embodiment, electronics RFID tag 16E is programmed at the time of manufacture with a unique identification number $N_E$ that can be used to determine features of rack-mounted electronics 12E using the database unit software, which in an example embodiment relating to a telecommunications system includes network management software. When the mated RFID tags 16E and 16R are polled by a signal SR from the RFID reader antenna, in an example they each respond by transmitting respective RFID tag signals ST (i.e., $ST_E$ and $ST_C$) that include the ID number $N_C$ and $N_E$ of their mating RFID tag, and optionally a status indicator (e.g., a bit sequence) that indicates that RFID tags 16E and 16R are mated.

Figure 8:
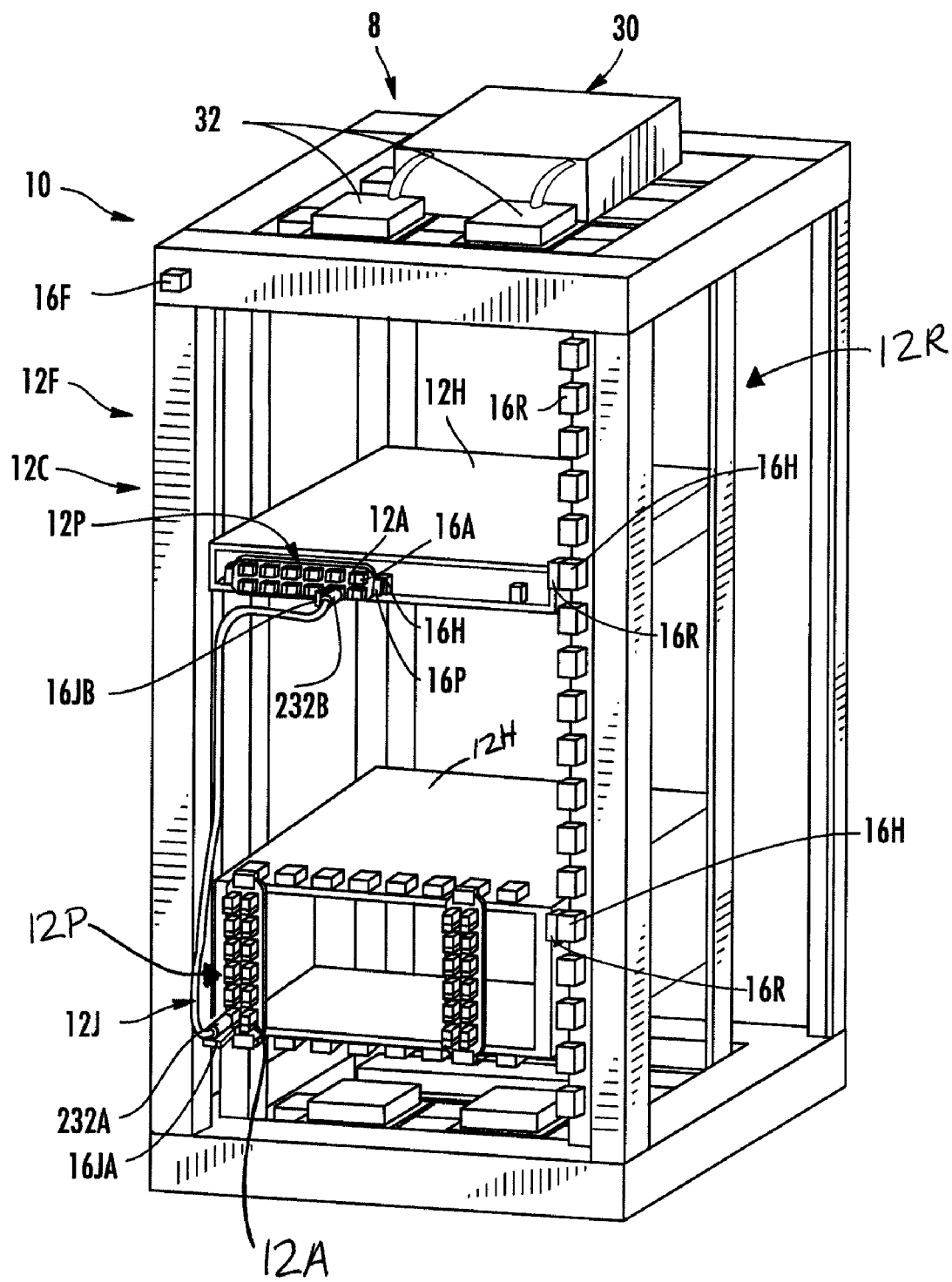
FIG. 8 is a schematic diagram similar to FIG. 7, and shows a sample telecommunications cabinet with a single jumper cable joining two adapters on two different patch panels of two different housings.

Now presented is an example showing how RFID system 8 can be used to automatically detect the physical configuration of a telecommunications data center having components such as cables, fibers and like equipment such as described above, and to direct the configuration of the system. FIG. 8 is a schematic diagram similar to FIG. 5A, showing a sample cabinet 12C wherein a single jumper cable 12J joins two adapters 12A on two different patch panels 12P in two different housings 12H. Each component 12 includes one or more RFID tags 16 with a unique ID number N.

Figure 9A:
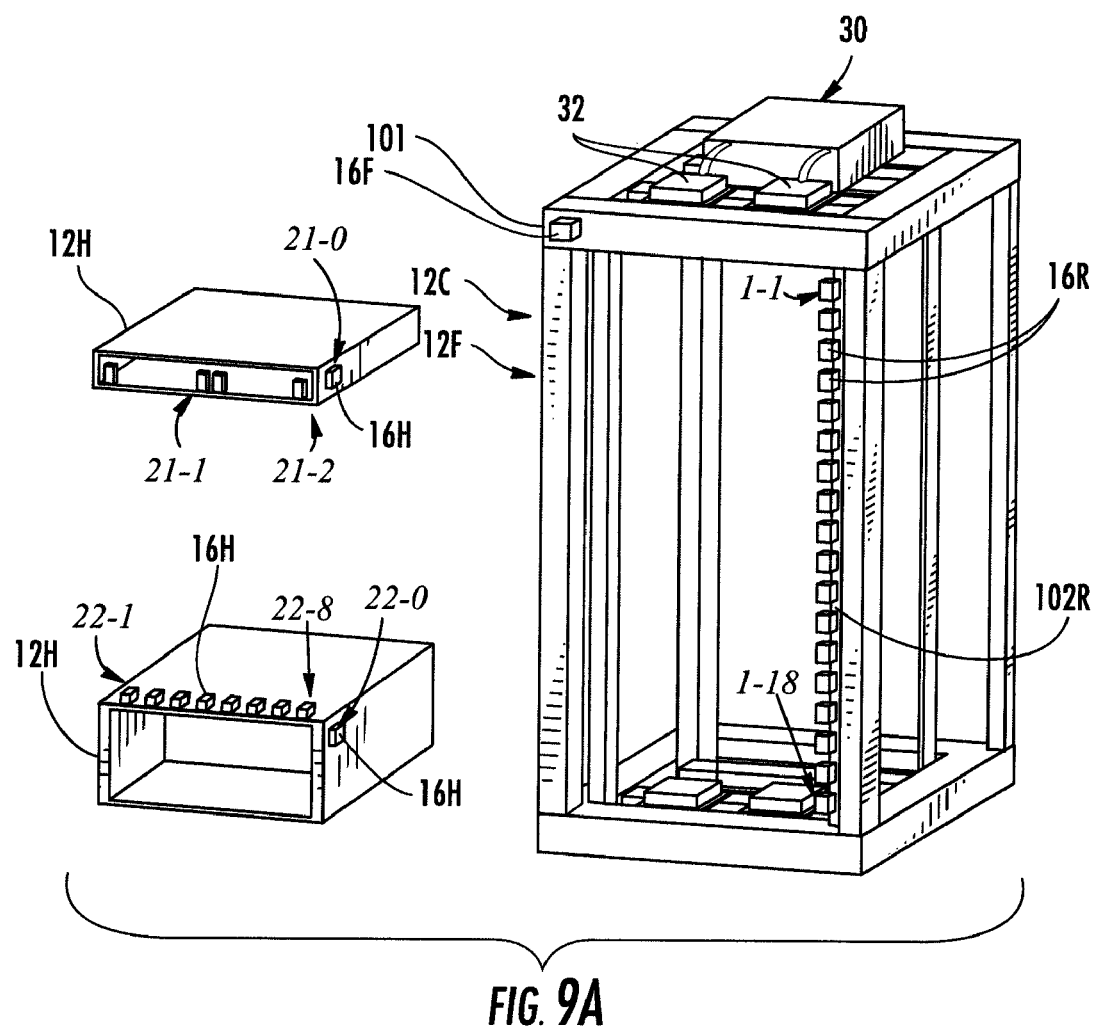
FIGS. 9A, 9B and 9C illustrate example embodiments of how individual RFID tags on various system components are provided with unique ID numbers N that include both a product serial number and a physical location in the complex system.
Figure 9B:
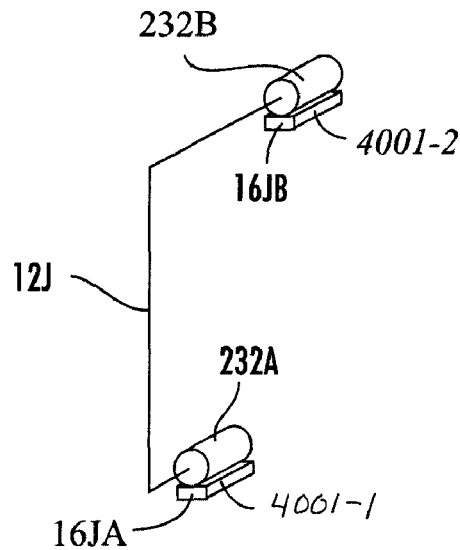
Figure 9C:
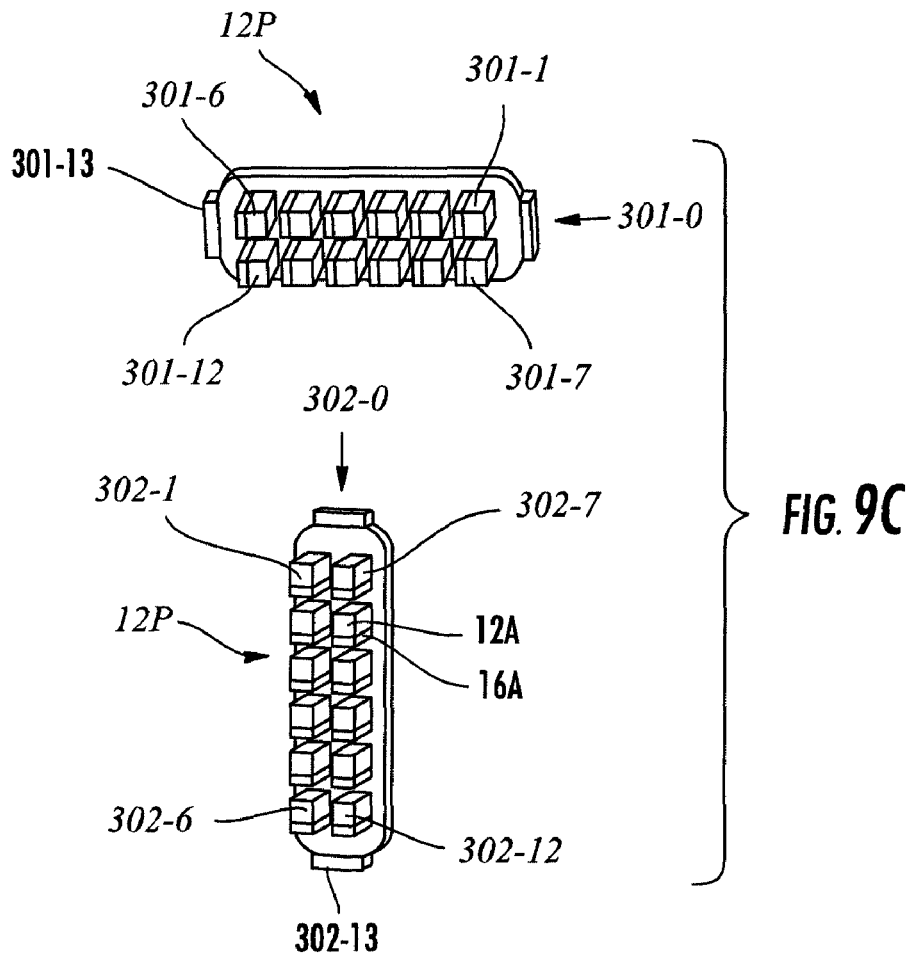

FIGS. 9A, 9B and 9C illustrate an example embodiment of how individual RFID tags 16 on various system components 12 of complex system 10 of FIG. 8 have unique ID numbers N that include, for example, a product serial number and a physical location of the RFID tag 16 in complex system 10. In FIGS. 9A, 9B and 9C, the ID numbers N for the various components 12 are shown in italics. In cases where a particular ID number N is not explicitly shown, it can be inferred from neighboring labeled RFID tags.

For example, with reference to FIG. 9A, the eighteen rail RFID tags 16R located on right front rail 102R of frame 12F have corresponding ID numbers $N_C$={1-1, 1-2, ... 1-18}. Likewise, the eight housing RFID tags 16H on the lower-most housing 12H have corresponding cabinet ID numbers $N_H$={22-1, 22-2, ... 22-8}, while the three housing RFID tags 16H on the upper-most housing 12H have housing ID numbers $N_H$={21-0, 21-1, ... 21-4}.

With reference now to FIG. 9B, the two jumper RFID tags 16JA and 16JB associated with respective connectors 232A and 232B have jumper ID numbers $N_J$={4001-1, 4001-2}. Likewise, with reference now to FIG. 9C, the twelve adapter RFID tags 16A associated with adapters 12A on upper-most patch panel 12P have patch-panel ID numbers $N_A$={301-1, 301-2, ... 301-12}, while the twelve adapter RFID tags 16A on the lower-most patch panel 12P have adapter ID numbers $N_A$={302-1, 302-2, ... 302-12}. Likewise, the upper-most patch-panel 12P has two patch-panel RFID tags with ID numbers $N_P$={301-0, 301-13}, while the lower-most patch-panel 12P has two patch-panel RFID tags with ID numbers $N_P$={302-0, 303-13}.

Figure 10A:
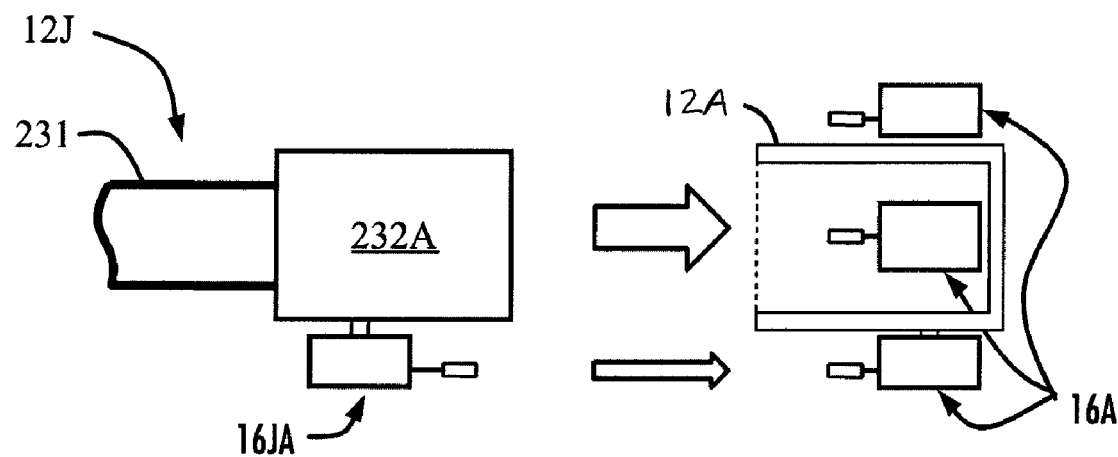
FIG. 10A is a schematic close-up side view similar to FIG. 6B, showing the jumper cable connector prior to being connected (mated) to a patch-panel adapter, wherein the adapter has associated therewith four adapter RFID tags arranged on respective sides of the adapter.
Figure 10B:
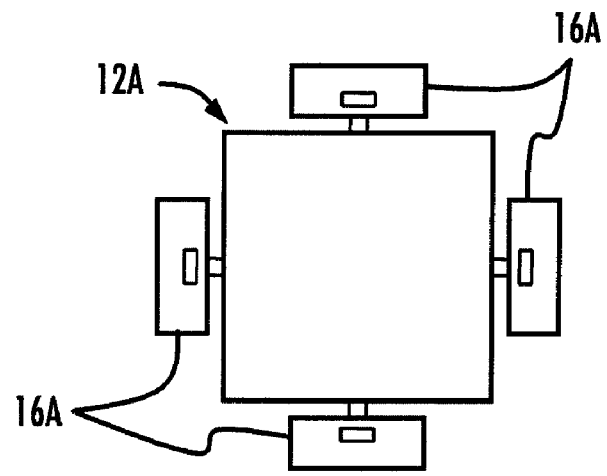
FIG. 10B is a front-on view of the adapter of FIG. 10A, along with the four associated adapter RFID tags arranged so that a given mating between the jumper RFID tag and one of the adapter RFID tags provides information regarding the orientation of the jumper connector relative to the adapter.

An example embodiment of RFID system 8 of the present invention uses RFID tags 16 to confirm that orientation-sensitive components 12 have been correctly installed into complex system 10. FIG. 10A is a schematic side view of connector 232A of jumper cable 12J being connected to an adapter 12A of patch panel 12P, wherein the adapter 12A includes four adapter RFID tags 16A arranged on respective sides of the adapter 12A. FIG. 10B is a front-on view of adapter 12A and the four associated adapter RFID tags 16A. Adapter RFID tags 16A include information about their respective positions relative to adapter 12A (i.e., top, bottom, left side, right side). In the case where it is possible to insert jumper connector 232A into adapter 12A in more than one orientation, the arrangement of adapter RFID tags 16A allows for one of the four adapter RFID tags 16A to mate with the jumper RFID tag 16JA. In the example shown in FIG. 10A and FIG. 10B, it is assumed that four different orientations are possible. In general, the arrangement of RFID tags 16 in FIG. 10A and FIG. 10B to establish orientation involves two or more RFID tags 16. This method allows for RFID system 8 to detect whether a given component—here, jumper cable 12J—is correctly installed in complex system 10. If incorrectly installed, database unit 50 (or signaling device 27) flags the improper connect condition and in an example embodiment, conspicuously indicates the improper connect condition so that an end-user can immediately spot the incorrect connection and take corrective action (e.g., insert connector 232A into adapter 12A in its proper orientation). This is one of the ways in which RFID system 8 facilitates configuring a complex system such as complex system 10.

When all of components 12 are finally installed in complex system 10 and RFID reader 30 has identified the set of all mated RFID tags 16, the component configuration information is provided to an end-user of complex system 10 (or an end-user of RFID system 8, as the case may be). In an example embodiment, information about the component configuration of complex system 10 is displayed on display 60 of information processing system 40. In an example embodiment, information processing system 40 includes a graphics driver and uses graphics to display a representation of complex system 10 on display 60.

Figure 11:
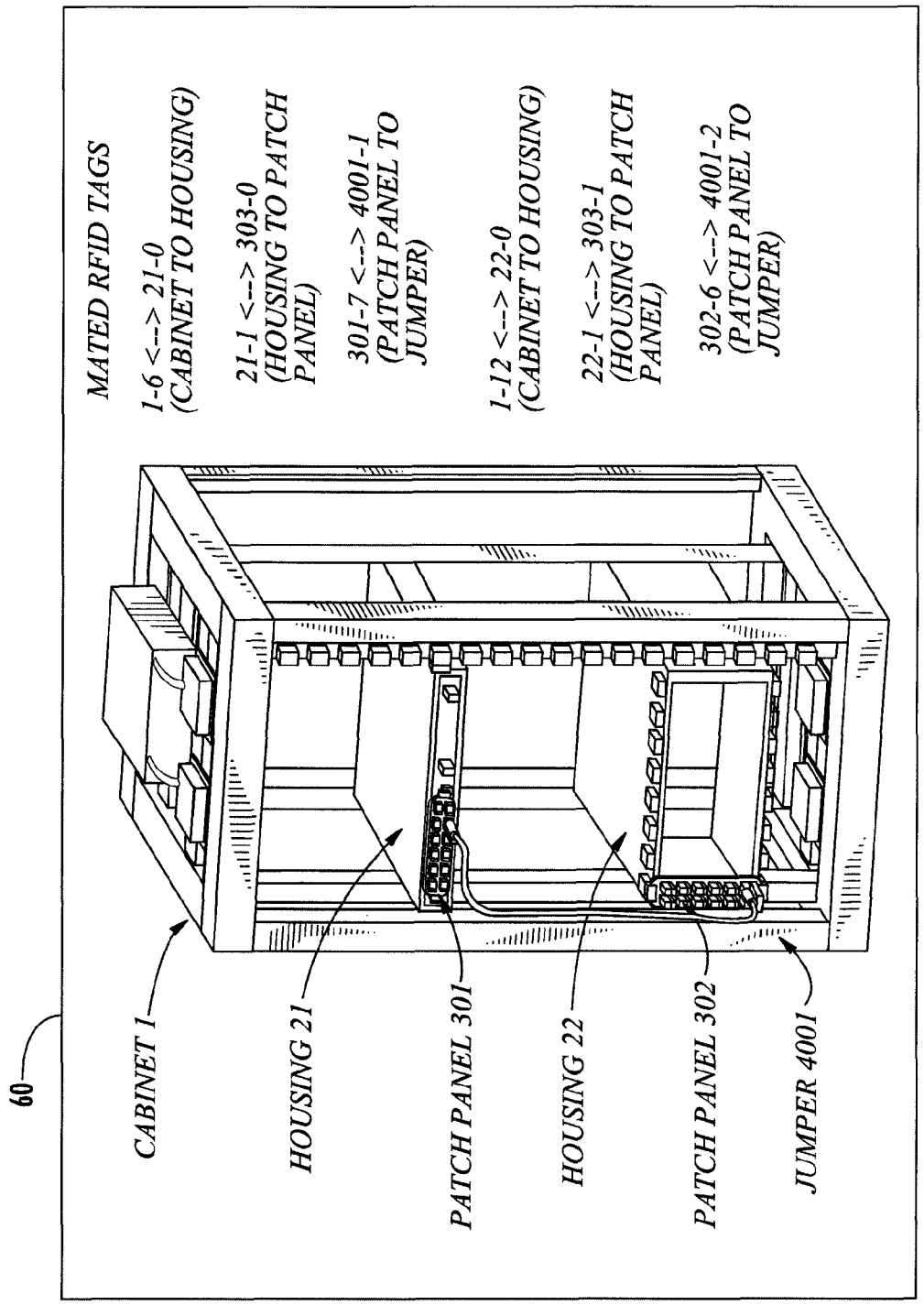
FIG. 11 shows an example of displaying the detected configuration of the example telecommunications system cabinet in the process of being configured.

FIG. 11 shows an example display 60 that displays graphic and/or alphanumeric information about the configuration of the above-described example complex system 10 in the form of telecommunications cabinet 12C. Display 60 shows the various network-related components 12C and a list of mated RFID tags 16 obtained by RFID tag reader 30. The information shown on display 60 is provided by database unit 50 and is based on ID number information provided by RFID reader 30 and so is presented in italics in FIG. 11 for the sake of illustration. The physical configuration, and hence the physical location, of each component 12 in complex system 10 can be inferred from the complete set of neighboring labeled RFID tags that are found to be mated to each other.

An example of providing a progressive summary of the evolving configuration of complex system 10 as based on individual mated RFID tag data of the type that might be communicated via display 60 of information processing system 40 via the operation of the network management software operating in database unit 50 is as follows:

1-6←→21-0
  Housing 21 is mounted in Cabinet 1, Rack position 6.
21-1←→4301-0
  Patch panel 301 is mounted in Housing 21, Patch panel position 1, in Cabinet 1, Rack position 6.
301-7←→4001-1
  Jumper 4001 Connector 1 is mounted in Patch panel 301, Adapter position 7, in Housing 21, Patch panel position 1, in Cabinet 1, Rack position 6.
1-14←→22-0
  Housing 22 is mounted in Cabinet 1, Rack position 14
22-1←→302-0
  Patch panel 302 is mounted in Housing 22, Patch panel position 1, in Cabinet 1, Rack position 14.
302-6←→4001-2
  Jumper 4001 Connector 2 is mounted in Patch panel 302, Adapter position 6, in Housing 22, Patch panel position 1, in Cabinet 1, Rack position 14.

Based on this information, the configuration of any component 12 in complex system 10 can be determined. For example, it is possible to determine how a specific jumper cable 12J is configured, and this information may be displayed on display 60 as follows:

Patch panel 301, Adapter position 7, in Housing 21, Patch panel position 1, in Cabinet 1, Rack position 6
with
Patch panel 302, Adapter position 6, in Housing 22, Patch panel position 1, in Cabinet 1, Rack position 14.

This particular telecommunication-based example utilizes a method that incorporates detection of a jumper cable to adapters, adapter attachment in patch panels, patch panel attachment to housings, and housing attachment to cabinets. While this hierarchical approach is well-suited for many communications network equipment applications, including data center management, there are other applications where a non-hierarchical interconnection of mating RFID tags is desirable. For example, consider determining the physical configuration of a two-dimensional array of components. RFID tags can be positioned on the four sides of each component, and arranged to mate with corresponding tags on neighboring components. In addition, similar approaches could be used in applications other than communications network equipment applications. For example, similar approaches could be used to assure proper assembly of complex mechanical, electrical, and optical structures, as well as complex structures that employ combinations of electrical, mechanical and optical components.

As discussed above, RFID tags 16 can include switches that allow for the RFID tag 16 to transmit information to RFID reader 30 about the component 12 to which the particular RFID tag 16 is attached. Thus, in an example embodiment, the method includes actively managing the configuration of complex system 10 as the complex system 10 is being configured, for example, by an on-site technician. This method includes, for example, activating the RFID tag 16 for a given component (for example, a component 12A of FIG. 1) prior to mating the component 12 with another component (for example, a component 12B of FIG. 1). The RFID reader 30 receives this RFID tag signal and consults information processing system 40, which tells the RFID reader 30 to which component 12B the component 12A is supposed to be mated. RFID reader 30 then transmits a signal to the corresponding RFID tag 16B, which in an example embodiment includes signaling device 27, such as a light, which is activated by the RFID reader signals via IC chip 20. This shows the technician to which component 12B the component 12A in hand is to be connected.

When the proper connection is made, confirmation is carried out as described above by both RFID tags 16A and 16B transmitting the other tags ID number N to RFID reader 30, which information is then transmitted to information processing system 40. If the particular components 12A and 12B are not supposed to be connected, then information processing system 40 sends a signal to RFID reader 30 that indicates an incorrect connection. RFID reader 30 then sends a signal to one or both RFID tags 16A and 16B to cause signaling device(s) 27 to be activated in a manner that indicates a connection error (e.g., blinking red lights).

Embodiments of the present invention have a number of advantages, particularly relating to the application to complex telecommunications systems. By standardizing the RFID tag-to-tag mating hardware, the same method for detecting installed network components can be applied to all types of data center network equipment, including components from different companies and manufacturers. Further, the ability to automatically monitor the configuration of a complex telecommunications system can be used to help guide the system installers to achieve the proper system configuration in less time and with fewer errors in the final system.

In an example embodiment, the database unit software includes network management software adapted to determine the current (i.e., real-time) physical configuration of a data center network using information from mated RFID tag pairs on network equipment. Thus, the system configuration can be constantly updated as changes are made to the system, such as components being mated (connected) and unmated (disconnected). This eliminates the need to manually record and enter physical location data on network equipment into network management software both during system set-up as well as during system maintenance or when changing the system configuration for any reason. It also ensures that the network management software database is completely accurate, even while new network equipment is being added or removed.

Another advantage of the embodiments disclosed herein is that the RFID configuration detection system can be set up to track the correct orientation of orientation-sensitive components and can be configured to provide detection redundancy should one of the RFID tags fail or should two tags fail to properly mate.

Many modifications and other embodiments of the invention set forth herein will come to mind to one skilled in the art to which the invention pertains having the benefit of the teachings presented in the foregoing descriptions and the associated drawings.

Therefore, it is to be understood that the invention is not to be limited to the specific embodiments disclosed and that modifications and other embodiments are intended to be included within the scope of the appended claims. It is intended that the present invention cover the modifications and variations of this invention provided they come within the scope of the appended claims and their equivalents. Although specific terms are employed herein, they are used in a generic and descriptive sense only and not for purposes of limitation.

What is claimed is:

1. A radio-frequency identification (RFID) system for detecting and/or directing a configuration of a complex system having a set of one or more types of mateable components, comprising:

a set of mateable RFID tags arranged so that each mateable component in the set includes at least one mateable RFID tag, wherein the at least one mateable RFID tag includes information relating to their associated mateable components and are arranged so that the mating of components results in the electrical mating of the corresponding mateable RFID tags;

at least one RFID reader adapted to read an RFID tag signal sent from at least one RFID tag in a mated pair of RFID tags, wherein the RFID tag signal contains information about the mated components; and an information processing system operably connected to the at least one RFID reader and adapted to receive and process information therefrom to establish a number and type of mated connections that constitute the complex system configuration.

2. The system of claim 1, wherein at least one of the mateable RFID tags is adapted to transmit an RFID tag signal that indicates an unmated status when two mated RFID tags become unmated.

3. The system of claim 1, wherein at least one mateable component includes two or more mateable RFID tags arranged so as to indicate an orientation of the at least one mateable component when mated with another mateable component.

4. The system of claim 1, including a database unit operably connected to a display operable to display information about the complex system configuration.

5. The system of claim 1, wherein:
the complex system is a telecommunication system, and wherein the set of mateable components includes one or more components selected from the group of components comprising: patch panels, patch-panel adapters, jumper cables, housings, equipment racks, and a cabinet;
the mateable RFID tags include unique ID numbers for each telecommunication system component; and
the information processing system includes basic information about the telecommunication system that is combined with configuration-status information provided by the at least one RFID reader in order to detect and communicate the telecommunication system configuration.

6. A radio-frequency identification (RFID) configuration detection system for detecting and/or directing a configuration of a complex system having a set of one or more types of mateable components, comprising:
at least one mateable RFID tag associated with each mateable component in the set of mateable components and having an antenna electrically connected to an integrated circuit (IC) chip, the IC chip being adapted to store information that includes information relating to its associated mateable component, wherein the at least one mateable RFID tag is arranged relative to its associated component such that mating two mateable components causes the corresponding at least one mateable RFID tag associated with the two mateable components to mate electrically and exchange the information stored therein, and to communicate information regarding their mated status via at least one wireless RFID tag signal;
at least one RFID reader adapted to receive the at least one wireless RFID tag signal from each mated pair of components; and
an information processing system operably connected to the at least one RFID reader and adapted to receive therefrom and process said mated status information to determine the complex system configuration.

7. The system of claim 6, wherein at least one of the mateable components is orientation sensitive and has associated therewith one or more mateable RFID tags arranged so as to establish a mating orientation when the at least one orientation-sensitive component is mated with another mateable component.

8. The system of claim 6, wherein the stored information in each IC chip includes a unique identification (ID) number relating to the associated mateable component.

9. The system of claim 6, wherein the information processing system includes a database unit adapted to store said mated status information on an ongoing basis to provide a real-time status of the complex system configuration.

10. The system of claim 9, wherein the information processing system includes a display operably coupled to the database unit and adapted to display information relating to the configuration of the complex system.

11. The system of claim 6, wherein the complex system includes a telecommunications network, and wherein the mateable components are selected from the group of mateable components comprising: a cabinet, an electronics rack, a rack-mountable electronic device, a rack-mountable electrical/optical device, a rack-mountable housing, a patch panel, a jumper cable, a switch, a router, and a server.

12. The system of claim 6, wherein the at least one RFID reader includes an antenna system having one or more antenna elements arranged relative to the complex system so as to detect RFID tag signals from different regions of the complex system.

13. The system of claim 12, wherein the at least one RFID reader is adapted to generate polling signals that elicit the RFID tag signals from the mated RFID tags.

14. A radio-frequency identification (RFID)-based method of detecting and/or directing a configuration of a complex system having a set of one or more types of mateable components, comprising:
providing each mateable component in the set with at least one mateable RFID tag that includes information about its associated mateable component, including arranging the at least one mateable RFID tag so that when two mateable components mate, the corresponding mateable RFID tags mate and exchange information about their respective mateable components;
mating a number of mateable components so as to cause the corresponding mateable RFID tags to mate electrically and exchange information about their respective mateable component;
for each pair of mated components, generating at least one RFID tag signal that includes information relating to the mated components; and
receiving and processing the at least one RFID tag signal from each pair of mated components to determine the complex system configuration.

15. The method of claim 14, wherein the generating of the at least one RFID tag signal includes, for at least one pair of mated components, generating one RFID tag signal from each mated RFID tag.

16. The method of claim 14, further including displaying the complex system configuration.

17. The method of claim 14, wherein the mateable RFID tags are polled periodically to elicit RFID tag signals to provide updated information about the complex system configuration.

18. The method of claim 14, wherein at least one of the types of mateable components is orientation sensitive, and further including:
arranging the at least one mateable RFID tag relative to the orientation-sensitive component so that a component orientation can be deduced when the orientation-sensitive component is mated with another component.

19. The method of claim 14, further including directing a change in the complex system configuration by:
causing an RFID tag to attract the attention of a system end-user with respect to one or more of the mateable components; and
indicating to the system end-user to connect at least one of the other mateable components to said one or more mateable components.

20. The method of claim 14, further including transmitting an RFID tag signal that indicates when two mated components become unmated.

* * * * *